United States Patent
Yudasaka

(10) Patent No.: US 7,294,155 B2
(45) Date of Patent: Nov. 13, 2007

(54) COATING APPARATUS, THIN FILM FORMING METHOD, THIN FILM FORMING APPARATUS, AND SEMICONDUCTOR DEVICE MANUFACTURING METHOD, ELECTRO-OPTIC DEVICE AND ELECTRONIC INSTRUMENT

(75) Inventor: Ichio Yudasaka, Chino (JP)

(73) Assignee: Seiko Epson Corporation, Tokyo (JP)

( * ) Notice: Subject to any disclaimer, the term of this patent is extended or adjusted under 35 U.S.C. 154(b) by 297 days.

(21) Appl. No.: 10/816,894

(22) Filed: Apr. 5, 2004

(65) Prior Publication Data

US 2004/0255848 A1 Dec. 23, 2004

(30) Foreign Application Priority Data

May 1, 2003 (JP) .............................. 2003-126317

(51) Int. Cl.
*H01L 21/00* (2006.01)
*H01L 21/64* (2006.01)

(52) U.S. Cl. ..................................... 29/25.01
(58) Field of Classification Search ................ 29/25.01
See application file for complete search history.

(56) References Cited

U.S. PATENT DOCUMENTS

2004/0087068 A1* 5/2004 Yudasaka .................... 438/149

FOREIGN PATENT DOCUMENTS

| JP | A-60-58266 | 4/1985 |
|---|---|---|
| JP | A-64-59919 | 3/1989 |
| JP | A 3-81626 | 4/1991 |
| JP | A-4-171935 | 6/1992 |
| JP | A 5-154430 | 6/1993 |
| JP | A-5-226482 | 9/1993 |
| JP | A-8-32085 | 2/1996 |
| JP | A 8-83762 | 3/1996 |
| JP | A 9-10657 | 1/1997 |
| JP | A 9-213693 | 8/1997 |
| JP | A 11-262720 | 9/1999 |
| WO | WO97/43689 | 11/1997 |

* cited by examiner

*Primary Examiner*—Fernando L. Toledo
(74) *Attorney, Agent, or Firm*—Oliff & Berridge, PLC

(57) ABSTRACT

A coating apparatus coats a liquid material on a substrate in a coating chamber. A first liquid supply system that supplies the liquid material is provided in the coating chamber. A second liquid supply system is provided in the first liquid supply system that supplies a liquid that cleans or that deactivates the liquid material remaining in the coating chamber and/or in the first liquid supply system. A coating apparatus, a thin film forming method, a thin film forming apparatus, a semiconductor device manufacturing method, an electro-optic device, and an electronic instrument are provided that enable a high performance thin film with few defects and with a high degree of reproducibility to be obtained, that allow maintenance of the apparatus to be performed efficiently and safely, and that enable a thin film to be formed at low cost.

20 Claims, 14 Drawing Sheets

COATING APPARATUS, THIN FILM FORMING METHOD, THIN FILM FORMING APPARATUS, AND SEMICONDUCTOR DEVICE MANUFACTURING METHOD, ELECTRO-OPTIC DEVICE AND ELECTRONIC INSTRUMENT

BACKGROUND OF THE INVENTION

1. Field of the Invention

Priority is claimed on Japanese Patent Application No. 2003-126317, filed May 1, 2003, the content of which is incorporated herein by reference.

The present invention relates to a technology for forming a thin film using a liquid material, and, in particular, to a coating apparatus, a thin film forming method, a thin film forming apparatus, a semiconductor device manufacturing method, an electro-optic device, and to an electronic instrument.

2. Description of Related Art

Conventionally, semiconductor devices employed in various types of electronic instrument are typically formed by thin films such as a semiconductor film, an insulating film, and a conducting film. In the formation of these films, a chemical vapor deposition (CVD) method and a sputtering method are mainly used. CVD methods include normal pressure CVD, low pressure CVD, plasma CVD, and optical CVD. Sputtering methods include an AC type and a DC type. An AC type is used for forming an insulating film, while a DC type is used for forming a conducting film.

In conventional CVD methods and sputtering methods, a vacuum apparatus, a power supply unit for generating plasma and the like, a gas supply apparatus for thin film formation, and control of a substrate temperature and the like are necessary. Moreover, the gas used in thin film formation is often toxic, flammable, and prone to spontaneous ignition. Consequently, a variety of ancillary equipment is necessary to ensure safety such as gas leak detectors, noxious substance removal apparatuses for rendering exhaust gas harmless, and exhaust systems in gas containers and gas pipe sections. Accordingly, conventional thin film formation apparatuses have the drawback of being high in cost and large in size. There are also an extremely large number of apparatus conditions contributing to the control of film thickness and film quality, so that conventional thin film formation apparatuses have the drawback that it is difficult to ensure uniformity and reproducibility. Furthermore, in these methods, because a solid phase thin film is formed from a gas phase, conventional thin film formation apparatuses have the drawback of poor productivity. In recent years, methods of manufacturing semiconductor devices and the like in which thin films are formed using methods that are different from the above conventional film formation methods have been proposed as methods for solving the above described problems.

For example, one method involves forming a desired thin film by forming a coating film by coating a liquid material on a substrate, and then heat processing the coating film. The basic thin film formation steps include a coating step in which a coating film is formed by coating a liquid material on a substrate, and a heat processing step for obtaining a desired thin film by performing heat processing on the coating film. According to these steps, a thin film can be formed at low cost and with a high degree of productivity using a small size, low cost apparatus. As a result, a low cost thin film device can be manufactured.

Coating methods such as a spin coating method or liquid discharge method (i.e., an inkjet method) are typically used for the coating step. In the spin coating method, for example, a spinner in which the task of attaching and detaching a cover that is required with any change in the processing solutions is simple (see, for example, Japanese Patent Application Unexamined Publication No. 5-154430), and a coating apparatus capable of supplying a coating solution to a substrate being processed with a lid of a rotating container in a closed state (see, for example, Japanese Patent Application Unexamined Publication No. 8-83762) have been proposed. In the inkjet method, an apparatus has recently been proposed (see, for example, Japanese Patent Application Unexamined Publication No. 9-10657) that forms a coating film having excellent uniformity on a substrate being coated by discharging a liquid from micro nozzles of an inkjet head onto the substrate being coated, while causing the substrate being coated and the inkjet head to move relatively between the area on the rotation shaft side and the area furthest therefrom as the substrate being coated and the inkjet head are rotated relatively.

Moreover, for the heat processing step, a method has been proposed in which an insulating film is baked in a kiln whose oxygen concentration has been adjusted to a fixed value or less (see, for example, Japanese Patent Application No. 9-213693). Furthermore, in a series of steps that includes a coating step and a heat processing step, a coating film formation method has been proposed (see, for example, Japanese Patent Application Unexamined Publication No. 11-262720) in which, for example, a coating solution is dripped onto a surface of an object being processed so that the coating solution is spread uniformly over the surface of the object being processed. A portion of this coating solution that is used to form a film seeps onto the bottom surface of the outer edge of the object being processed, and in that state, the object being processed is transported to a decompression drying apparatus and is dried to a certain extent. It then undergoes heat drying.

However, as was shown in the conventional technology, although a thin film forming apparatus that continuously performs a coating step and a heat processing step, and a variety of coating apparatuses and heat processing apparatuses that are used in the various steps have been proposed, further improvements are required in order, particularly, to improve the performance of the coating apparatus and heat processing apparatus, as well as achieve a reduction in both the size and cost thereof, which in turn will bring about an improvement in the performance of the overall thin film forming apparatus as well as achieve a reduction in both the size and cost thereof.

Moreover, some liquid materials used to form a coating film have problems with regard to safety. For example, because the liquid material normally contains an organic solvent, it is flammable. Consequently, as far as possible, metal materials are used for the members constituting the thin film forming apparatus, and no flammable materials such as plastic materials are used at least in the chamber where the coating step is performed. In addition, other measures need to be implemented such as providing a structure for expelling vapor from the organic solvent. It cannot be said, however, that conventional coating apparatuses and thin film forming apparatuses are always formed in this manner.

If the liquid material is one that requires particular care as regards safety, such as liquid materials that generate noxious gas, or that are prone to spontaneous combustion in an oxygen atmosphere, then it has not been possible, essentially, to use such a liquid material in a conventional coating apparatus and thin film forming apparatus.

Furthermore, when forming a semiconductor film or metal film from a liquid material, it is necessary to strictly control the processing atmosphere in the coating and heat processing steps. However, there has not been satisfactory control of the processing atmosphere in conventional thin film forming apparatuses. For example, when forming a Si film, if the coating step and heat processing step are performed in an atmosphere in which even a small amount of oxygen is present, a silicon oxide film ends up being formed in the Si film, resulting in a deterioration in the performance thereof as a semiconductor film. It is necessary in the formation of this type of thin film to control the oxygen concentration to, for example, 10 ppm or less, however, the specific structure required for this has not been proposed conventionally.

Moreover, if the liquid material is left unused for a long period of time, a rise in viscosity and precipitation of solid components is brought about by the volatility of the solvent and chemical reactions and the like. As a result, problems arise such as blockages occurring in the liquid material supply and control systems, and a thin film that contains a large number of defects being formed. In conventional coating apparatuses and thin film forming apparatuses, however, sufficient countermeasures against such problems have not been provided.

The present invention was conceived in view of the above circumstances, and it is an object thereof to provide a coating apparatus, a thin film forming method, a thin film forming apparatus, a semiconductor device manufacturing method, an electro-optic device, and an electronic instrument that enable a high performance thin film with few defects to be obtained, that allow maintenance of the apparatus to be performed efficiently, and that enable a thin film to be formed with a high level of safety.

SUMMARY OF THE INVENTION

In order to solve the above described problems, according to an aspect of the present invention, there is provided a coating apparatus that coats a liquid material on a substrate in a coating chamber, comprising: a first liquid supply system provided that supplies the liquid material to the coating chamber, and a second liquid supply system provided that supplies a liquid to the first liquid supply system that cleans or that deactivates the liquid material remaining at least either in the coating chamber or in the first liquid supply system.

According to this coating apparatus, it is possible to remove or render harmless liquid material remaining in the first supply system using a cleaning agent or deactivation agent.

When a coating film is formed using a spin coating method, for example, 90% or more of the dripped liquid material is scattered to the periphery of the substrate by the rotation of the substrate. This scattered liquid material is captured by a receiving bowl that is provided at the periphery of the substrate and is guided to a waste liquid system, however, some of it still remains inside the coating chamber. If left for an extended period of time, this remaining liquid material dries to become a solid powder that causes defects when a coating film is subsequently formed.

However, according to the above described coating apparatus, because it is possible to clean or render harmless the remaining liquid material and, moreover, guide it to a waste liquid system, it becomes possible to form a thin film having few defects.

In addition, there are also times when a coating chamber needs to be opened to the air to perform maintenance or non-routine tasks. Because a large number of liquid materials are flammable and some liquid materials are toxic and ignitable, the maintenance and non-routine tasks can be hazardous. However, according to the above described coating apparatus, it is possible for these tasks to be performed safely.

Preferably, the above described coating apparatus further comprises a control mechanism provided with the coating chamber that controls an atmosphere in the coating chamber independently.

By employing this type of structure, because the coating of the liquid material can be continuously carried out in a controlled atmosphere, the liquid material and coating film formed on the substrate are not exposed to the air, so that it is possible to considerably limit oxides contained in a thin film that is obtained, and to consequently form an excellent thin film having the desired characteristics.

Preferably, in the above described coating apparatus, a plurality of the second liquid supply systems are provided and at least one of the second liquid supply systems is a system that supplies a cleaning agent for cleaning the liquid material remaining at least either in the coating chamber or first liquid supply system, and at least one other of the second liquid supply systems is a system that supplies a deactivation agent for deactivating liquid material remaining at least either in the coating chamber or first liquid supply system.

If this type of structure is employed, in cases such as when the cleaning agent has no function as a deactivation agent, or such as when different liquid materials efficiently demonstrate the respective functions of cleaning and deactivation, then it becomes possible to supply both cleaning agent and deactivation agent from different liquid supply systems. Accordingly, it is easy to perform both the cleaning and the deactivation of the coating chamber or the first liquid supply system.

Preferably, in the above described coating apparatus, the coating chamber has a spin coater provided therein.

If this type of structure is employed, the coating of droplets can be performed excellently using a spin coating method.

Preferably, in the above described coating apparatus, the first liquid supply system comprises a container that accumulates the liquid material, a drip rate control section that controls a quantity of the liquid material that is drawn out from the container, and a nozzle section that discharges the liquid material, and the container, drip rate control section, and nozzle section are positioned in a vertical direction in this order from top to bottom, and a liquid material pipe that connects each of these sections does not have a portion that is horizontal relative to the vertical direction such that the liquid material pipe all runs in a vertical direction.

If this type of structure is employed, then because it is possible to make the liquid material flow from the liquid material container to the nozzle section by its own gravity, it becomes possible to accurately control the quantity of liquid material dripped onto the substrate. Accordingly, the film thickness of the coating film and of a thin film obtained by performing heat processing on the coating film can be made uniform.

Preferably, in the above described coating apparatus, the coating chamber has a droplet discharge section provided therein that discharges micro droplets, and the droplet discharge section has a function of dripping micro droplets on a predetermined position on a substrate held on a stage by moving relatively to the stage holding the substrate.

If this type of structure is employed, then because it is possible to drip micro droplets of liquid material onto predetermined positions of a substrate, a coating film having a desired configuration can be formed from micro droplets.

Preferably, in the above described coating apparatus, the coating chamber has a waste liquid collection mechanism provided therein that collects as waste liquid that is no longer necessary after having been introduced into the coating chamber.

If this type of structure is employed, in cases when the liquid material has properties, for example, of flammability or toxicity, or of natural ignitability, then if this liquid material remains in the coating chamber, it can be rapidly removed from the coating chamber and collected. Accordingly, the level of safety of the apparatus can be improved. Moreover, because it is possible in the same way to also remove from the coating chamber cleaning agent and deactivation agent introduced into the coating chamber, an excellent coating film (i.e., a thin film) can be formed from a liquid material.

According to another aspect of the present invention, there is provided a thin film forming method that coats a liquid material on a substrate in a coating chamber to form a thin film on the substrate, comprising: supplying the liquid material to the coating chamber by a first liquid supply system to form a thin film on the substrate; and subsequently supplying a liquid that cleans the liquid material or that deactivates the liquid material to the first liquid material supply system by a second liquid supply system such that the liquid material remaining at least either in the coating chamber or in the first liquid supply system is washed or deactivated.

According to this thin film forming method, it is possible to remove or render harmless liquid material remaining in the first supply system using a cleaning agent or deactivation agent. Moreover, it is possible to prevent defects from being created in a coating film (i.e., in a thin film) that are caused by remaining liquid material. Furthermore, even if the liquid material has properties, for example, of flammability or toxicity, or of natural ignitability, maintenance and non-routine tasks can be performed safely.

According to still another aspect of the present invention, there is provided a thin film forming apparatus comprising: the above described coating apparatus; and a heat processing apparatus that heats a substrate on which a liquid material has been coated by the coating apparatus, wherein the coating apparatus and the heat processing apparatus are each provided with a control mechanism that controls an atmosphere in a processing chamber for processing the substrate independently for the coating apparatus and for the heat processing apparatus.

By employing this type of structure, in the coating apparatus, in particular, as described above, it is possible to remove or render harmless liquid material remaining in the first supply system using a cleaning agent or deactivation agent.

Moreover, because the coating and the heat processing of the liquid material can be continuously carried out in a controlled atmosphere, the liquid material and coating film formed on the substrate are not exposed to the air, so that it is possible to considerably limit oxides contained in a thin film that is obtained, and to consequently form an excellent thin film having the desired characteristics.

Preferably, the above described thin film forming apparatus further comprises a preprocessing apparatus that performs preprocessing such as cleaning a surface of the substrate, and the preprocessing apparatus is also provided with a control mechanism that controls independently an atmosphere in a processing chamber where processing of the preprocessing apparatus is performed.

By employing this type of structure, it becomes possible to control the atmosphere of a preprocessing chamber of a preprocessing apparatus as well to a suitable atmosphere. Accordingly, an atmosphere can be suitably selected to correspond to the content of the preprocessing and employed without the atmospheric gas of the preprocessing chamber affecting the atmospheres of other processing chambers (i.e., the coating chamber or heat processing chamber).

Preferably, the above described thin film forming apparatus further comprises a connecting chamber that is connected to the processing chamber of each of the apparatuses, and the connecting chamber is also provided with a control mechanism that controls independently an atmosphere in the connecting chamber.

By employing this type of structure, when moving a substrate from the processing chamber of each apparatus to another processing chamber, or when temporarily storing a substrate, by placing the substrate in the connecting chamber and by controlling the atmosphere of this connecting chamber in advance using a control mechanism, the substrate can be held in a desired atmosphere without the substrate being exposed to the air. Accordingly, it is possible to prevent oxidization and the like caused by oxygen in the air. Moreover, because each processing chamber is connected via the connecting chamber, the effects of the atmospheric gas of each processing chamber on the atmosphere of other processing chambers can be reduced.

According to still another aspect of the present invention, there is provided a semiconductor device manufacturing method comprising forming either functional layer of each functional layer constituting a semiconductor device by coating a liquid material containing a constituent element of the functional layer on a substrate, wherein the step of forming the functional layer comprises using the above described thin film forming method to form the functional layer.

According to this semiconductor device manufacturing method, as a result of it being possible to prevent defects from being created in a coating film (i.e., in a thin film) that are caused by liquid material remaining in the coating chamber, a functional layer (i.e., a thin film) having the desired characteristics can be formed. Accordingly, a high-performance, low-cost semiconductor device can be manufactured.

According to yet another aspect of the present invention, there is provided an electro-optic device comprising the above described semiconductor device.

Note that the term "electro-optic device" used in the present invention generally refers to a device that is provided with an electro-optic element that by electrical action emits light or changes the state of light from outside the device, and includes both devices that generate light by themselves and devices that control the passage of light from the outside. Examples of an electro-optic device include liquid crystal elements, electrophoresis elements, electroluminescence (EL) elements, and electron emission elements that generate light by firing electrons generated by the application of an electrical field at a light emitting plate.

According to this electro-optic device, because it is provided with a high-performance semiconductor device, the electro-optic device itself also has a high level of performance.

According to yet another aspect of the present invention, there is provided an electronic instrument comprising the above described semiconductor device or the above described electro-optic device.

Note that the term "electronic instrument" used in the present invention generally refers to an instrument that performs a fixed function using a combination of a plurality of elements or circuits, and is formed, for example, so as to include an electro-optic device and memory. Here, the electronic instrument can be provided with one circuit substrate or with a plurality of circuit substrates. The structure thereof is not particularly restricted, however, examples thereof include IC cards, mobile telephones, video cameras, personal computers, head-mounted displays, rear-type or front-type projectors, and also fax machines having a display function, viewfinders of digital cameras, portable televisions, DSP apparatuses, PDA, electronic notebooks, electric information boards, electric advertising displays and the like.

According to this electronic instrument, because it is provided with a high-performance semiconductor device or electro-optic device, the electronic instrument itself also has a high level of performance.

DETAILED DESCRIPTION OF THE INVENTION

The present invention will now be described in detail with reference made to the accompanying drawings.

First Embodiment (Thin Film Forming Apparatus)

Figure 1:
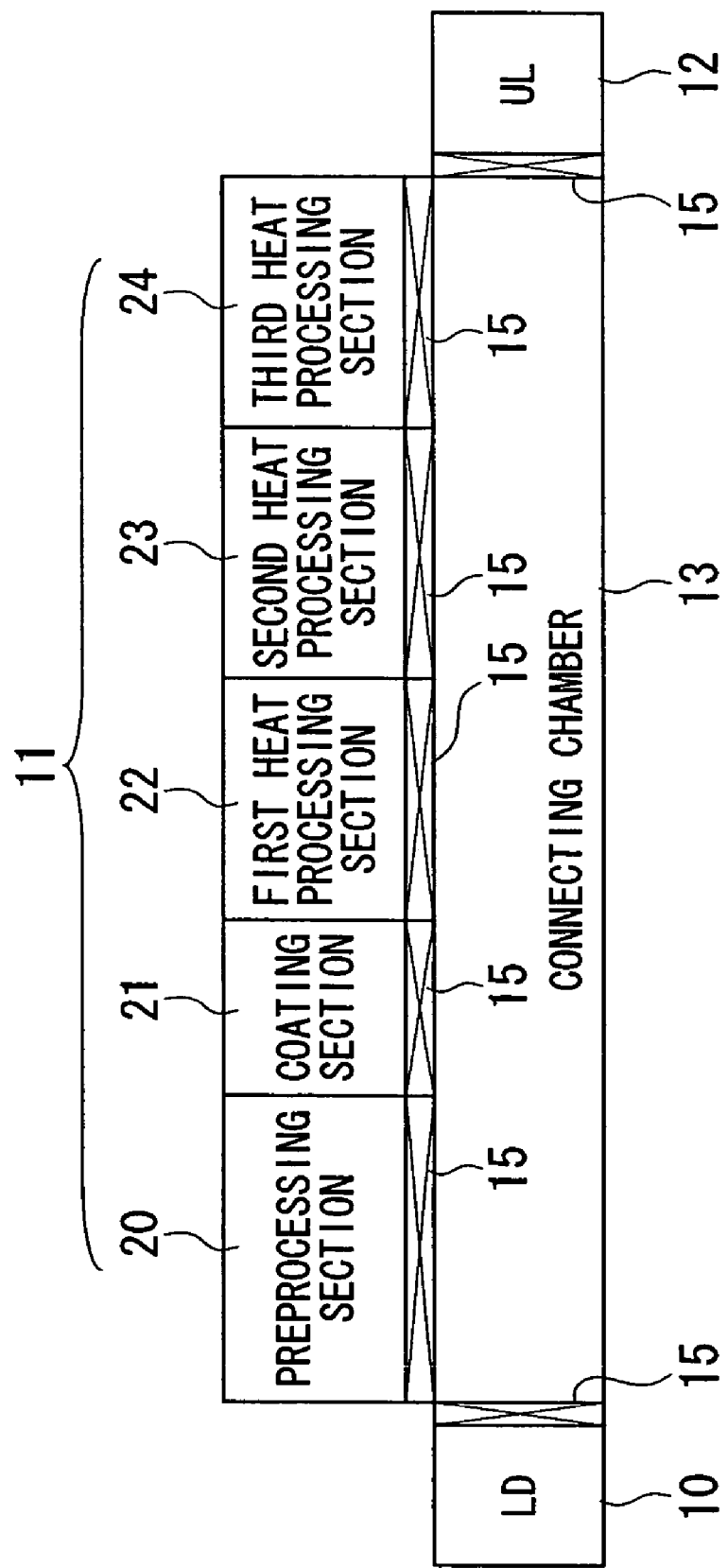
FIG. 1 is a schematic structural view showing a thin film forming apparatus according to a first embodiment of the present invention.

FIG. 1 shows a first embodiment of the thin film forming apparatus of the present invention. This thin film forming apparatus is suitable for implementing the thin film forming method of the present invention and is constructed by a loader (LD) 10 that introduces a substrate used for forming a thin film, a processing section 11 that performs a variety of thin film forming steps on a substrate introduced from the loader 10, an unloader (UL) 12 that stores substrates on which a thin film has been formed in the processing section 11, and a connecting chamber 13 that is connected to the loader 10, the processing section 11, and the unloader 12 and is where substrates are transported. The loader 10, the respective processing chambers of the processing section 11, and the unloader 12 are constructed so as to communicate with the connecting chamber 13 via respective gate valves 15. As is described below, a supply system that supplies various types of gas (i.e., oxidizing gas, reducing gas, and inert gas) and an exhaust system that is connected to an exhaust facility are both connected to each section 20 to 24 of the processing section 11. As a result, the internal pressure and atmosphere of each of the sections 20 to 24 can be independently controlled. Note that it is desirable that mechanisms for controlling the internal atmospheres of the loader 10, the unloader 12, and the connecting chamber 13 be installed therein so that air cannot enter into the atmospheres in each of the sections 20 to 24 of the processing section 11.

The processing section 11 is provided with a preprocessing section 20, a coating section 21, and a heat processing section. The heat processing section is formed in three sections made up by a first heat processing section 22, a second heat processing section 23, and a third heat processing section 24. In the preprocessing section 20, preprocessing, which is processing before a liquid material is coated on a substrate, is performed. In the coating section 21 a coating film is formed by coating the liquid material on the substrate using a spin coating method or the like. In the first heat processing section 22, components that are volatilized at a comparatively low temperature such as solvents contained in the coating film are removed. In the second heat processing section 23, the coating film from which the solvents have been removed is baked at a high temperature. In the third heat processing section 24, heat processing is performed at an even higher temperature so as to improve the film quality and form the desired thin film.

Here, as is described below, a control mechanism formed by an exhaust apparatus, a vacuum apparatus (not shown), and introducing apparatuses for introducing various types (i.e., oxidizing, reducing, and inert) of gas are provided for each of the processing sections, namely, the preprocessing section 20, the coating section 21, the first heat processing section 22, the second heat processing section 23, the third heat processing section 24, and the connecting chamber 13. As a result, the atmospheric gas type and pressure and the like of the atmosphere in each processing section and in the connecting chamber 13, namely, the processing atmosphere in each step can all be controlled independently.

Each of the processing sections will now be described specifically. In the preprocessing section 20, as preprocessing for the substrate, cleaning processing to clean the substrate surface and surface processing to appropriately adjust the solution affinity or solution repellency of the substrate surface are performed. For these processings, a method in which surface processing is performed by irradiating ultraviolet light onto the substrate surface and generating ozone inside a processing chamber, a method in which surface processing is performed on a substrate surface by generating atmospheric plasma, and the like are employed. In these processing methods, because, in some cases, it is also effective to heat the substrate, it is also possible to heat the substrate where required. Note that it is also possible to have a plurality of processing chambers in order to perform different surface processings.

Figure 2:
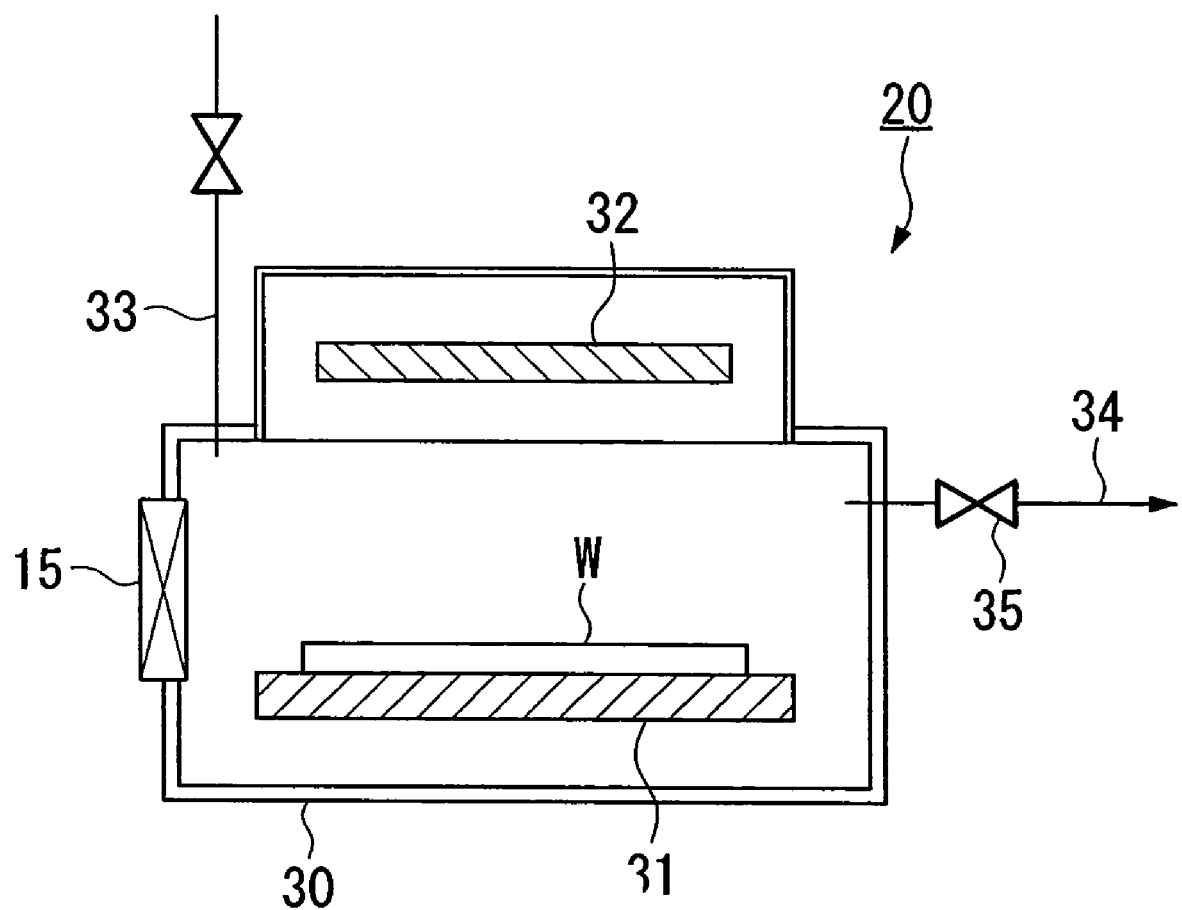
FIG. 2 is a schematic structural view of a preprocessing section.

FIG. 2 shows the schematic structure of the preprocessing section 20 that performs surface processing by irradiating ultraviolet light.

The preprocessing section 20 is connected to the connecting chamber 13 via the gate valve 15, as is shown in FIG. 1, and is constructed by a chamber 30 that maintains an airtight internal atmosphere, a substrate stage 31 that holds a substrate W and is provided with a heating mechanism (not shown), a UV lamp 32 that irradiates ultraviolet light into the interior of the chamber 30, a gas supply system 33 that supplies various types of atmospheric gas to the interior of the chamber 30 in order to control the atmosphere therein, and an exhaust system 34 that expels the gas inside the chamber 30. A raising and lowering mechanism (not shown) is provided for the substrate stage 31 so that the distance between the substrate and the UV lamp is able to be changed. Note that the gas supply system 33 is able to supply a plurality of gases, and a gas is able to be supplied to satisfy an objective of the preprocessing. Moreover, it is also possible to perform more accurate atmosphere control by installing in the chamber 30 a pressure sensor (not shown) in order to detect the pressure inside the chamber 30 and atmosphere sensors in order to detect the types of gas and concentrations thereof in the processing atmosphere and the like, and by feeding outputs from the sensors back to the gas supply system 33 and the exhaust system 34.

The heating mechanism provided for the substrate stage 31 has a heating apparatus such as, for example, a hotplate, and is constructed so as to be able to remove moisture adhering to the top of the substrate W. An excimer lamp that includes a wavelength of, for example, 172 nm is employed for the UV lamp 32. Oxygen supplied from the gas supply system 33 is decomposed by ultraviolet light so that ozone is generated, and organic impurities on the substrate W are broken down and the surface of the substrate can be made either hydrophilic or lyophilic. In addition, because 172 nm UV light has an action of directly decomposing and removing organic matter adhering to the substrate, it is possible to increase the substrate purifying effect by controlling the distance between the substrate and the UV lamp 32 as well as by controlling the atmospheric gas and the pressure thereof.

In addition to the aforementioned oxygen (i.e., oxidizing gas), reducing gas (for example, hydrogen) and inert gas (for example, nitrogen), or a gas containing fluorine can be supplied as is appropriate from the gas supply system 33 to the interior of the chamber 30. An exhaust apparatus or a vacuum apparatus (not shown) is connected to the exhaust system 34, and is possible to maintain the pressure within the chamber 30 at substantially atmospheric pressure by controlling a variable valve 35 in accordance with the quantity of gas supplied to the interior of the chamber 30. Furthermore, when a processed substrate W is moved to another processing chamber, the exhaust system 34 also has the role of inhibiting leakages of oxidizing gas to the other processing chamber by expelling the oxidizing gas that has temporarily filled the interior of the chamber 30 and by then supplying inert gas to the interior of the chamber 30.

Note that, in the present embodiment, a description is given of when the preprocessing section 20 irradiates ultraviolet light so as to perform surface processing, however, the present invention is not limited to this. For example, the preprocessing section 20 may also have a step in which ozone is generated at peripheral portions of the substrate and the substrate surface is cleaned by irradiating ultraviolet light onto the substrate surface, and a step in which atmospheric plasma is generated so that the surface of the substrate is cleaned and refined. By performing processing such as cleaning the substrate surface even when the above steps are employed, it is possible to improve the wettability and adhesion when coating the liquid material, or conversely to lower the wettability and adhesion. Specifically, for example, when surface processing is performed on the substrate surface using atmospheric plasma, by using oxygen plasma it is possible to remove organic contaminants from the substrate surface and make the substrate surface lyophilic. If plasma containing a fluorine such as $CF_4$ gas is used, the substrate surface can be made liquid repellent.

Figure 3:
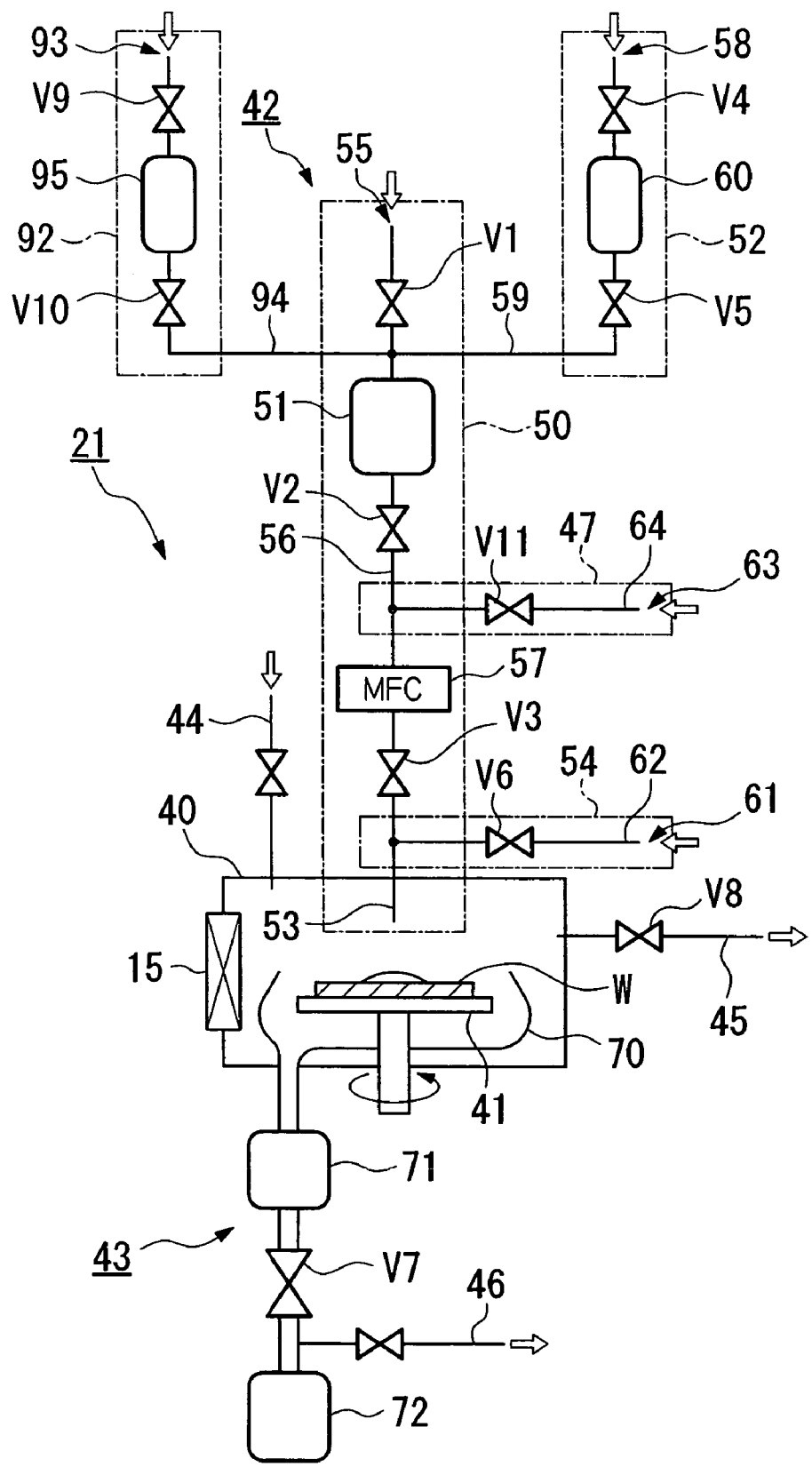
FIG. 3 is a schematic structural view of a coating section (coating apparatus).

The schematic structure of the coating section 21 is shown in FIG. 3.

The coating section 21 is connected to the connecting chamber 13 via a gate valve 15, as is shown in FIG. 1, and is constructed by a chamber (coating chamber) 40 that maintains an airtight interior atmosphere, a substrate stage 41 that holds a substrate W and is provided with a rotation mechanism (not shown), a liquid supply system 42, a waste solution processing system (i.e., a waste solution collection mechanism) 43 that captures liquid material scattered by the rotation force of the substrate stage 41 and collects it as waste liquid, a gas supply system 44 that supplies various types of atmospheric gas to the interior of the chamber 40, and an exhaust system 45 that expels gas from the interior of the chamber 40. Here, the coating section 21 corresponds to a first embodiment of the coating apparatus of the present invention, and, in the present embodiment, in particular, is constructed such that coating is performed by a spin coating method.

The liquid supply system 42 is constructed to include a liquid material supply system (i.e., a first liquid supply system) 50 that supplies a liquid material used for forming a thin film on the substrate W, a cleaning agent supply system (i.e., a second liquid supply system) 52 and a deactivation agent supply system (i.e., a second liquid supply system) 92, and purge mechanisms 47 and 54.

The liquid material supply system 50 is constructed to include a gas supply section 55 that has the role of introducing a gas so as to push out liquid material, a liquid material container 51, a nozzle (i.e., a nozzle section) 53, a liquid material drip quantity control section that is provided between the liquid material container 51 and the nozzle 53, and pipes 56 and the respective valves (V1 to V3) that connect each of these sections. The drip quantity control section is constructed by a mass flow controller (referred to below as MFC) 57 that controls the flow rate of the liquid material, and valves V2 and V3 that are provided above and below the MFC 57. Note that the purpose of the liquid material flow rate controller is to control the drip quantity of liquid material that drips onto the substrate from the nozzle 53, and, therefore, a needle valve may also be used instead of the MFC, or the drip quantity may be controlled simply by controlling the timing of the opening and closing operations of the valve V3.

Here, in this liquid material supply system 50, the liquid material container 51, the MFC 57, and the nozzle 53 are arranged in a vertical direction in this order from top to bottom. Furthermore, the pipes 56 that connect each of these sections have no horizontal portions and are all arranged running in a vertical direction. Because it has this type of structure, the liquid material supply system 50 is able to allow the liquid material to flow efficiently from the liquid material container 51 to the nozzle 53 by its own gravity. As a result, the quantity of liquid material dripping onto the substrate W can be controlled precisely. Moreover, if liquid material inside the liquid material container 51 or the pipes 56 unexpectedly flows out during maintenance or the like, because it is guided into the chamber 40 by its own gravity, the liquid material does not spread to the outside of the coating apparatus.

Note that the liquid material container 51 is able to be removed from the liquid supply system 42 after the first valve V1 and the second valve V2 have been closed.

The cleaning agent supply system 52 has the function of cleaning not only the liquid material supply system 50 but also of cleaning the waste solution processing system 43 and the interior of the chamber 40 via the liquid material supply system 50. Therefore, in the present embodiment, the cleaning agent supply system 52 is constructed so as to be connected to a top portion of the liquid material container 51 of the liquid material supply system 50. Namely, the cleaning agent supply system 52 is constructed by a cleaning agent container 60 that is provided inside a pipe 59 that connects a gas introduction section 58, which has the role of introducing a gas so as to push out cleaning agent, with the pipes 56 of the liquid material supply system 50, and that temporarily stores cleaning agent and then supplies cleaning agent to the liquid material supply system 50, and a fourth valve V4 and a fifth valve V5 that are positioned at two connecting portions in two locations of the pipe 59 that is connected to the cleaning agent container 60. Note that the cleaning agent container 60 is able to be removed from the pipe 59 after the fourth valve V4 and the fifth valve V5 have been closed.

In the same way as for the cleaning agent supply system 52, the deactivation agent supply system 92 also has a function of deactivating liquid material that remains not only in the liquid material supply system 50, but also in the waste liquid processing system 43 and the interior of the chamber 40 via the liquid material supply system 50. Namely, in the same way as for the cleaning agent supply system 52, the deactivation agent supply system 92 is also connected to the top portion of the liquid material container 51 of the liquid material supply system 50, and is constructed by a deactivation agent container 95 that is provided inside a pipe 94 that connects a gas introduction section 93, which has the role of introducing a gas so as to push out deactivation agent, with the pipes 56 of the liquid material supply system 50, and that temporarily stores deactivation agent and then supplies deactivation agent to the liquid material supply system 50, and a ninth valve V9 and a tenth valve V10 that are positioned at two connecting portions in two locations of the pipe 94 that is connected to the deactivation agent container 95. Note that the deactivation agent container 95 is also able to be removed from the pipe 94 after the ninth valve V9 and the tenth valve V10 have been closed.

Here, the cleaning agent used in the cleaning agent supply system 52 can be appropriately selected in accordance with the liquid material being used, however, specifically, cleaning agents such as alcohol based solutions and the like are used. The deactivation agent used in the deactivation agent supply system 92 may also be appropriately selected in accordance with the liquid material being used. For example, if the liquid material is cyclosilane ($Si_nH_{2n}$—wherein $n \geq 5$) or high order silane ($Si_nH_{2n+2}$—wherein $n \geq 3$) that are used for forming a silicon film, then, for example, tetramethyl ammonium hydrooxide (TMAH) or isopropanol (IPA) may be favorably used. Namely, because cyclosilane and high order silane may ignite spontaneously in contact with air and generate gases harmful to humans, materials are used as the deactivation agent that are able to decompose these so as to render them noncombustible and harmless so that, as a result, their activity, namely, their ignitability and toxicity can be obviated, and TMAH and IPA have the property that they are able to excellently decompose cyclosilane and high order silane. Note that TMAH has a greater deactivation effect than IPA on cyclosilane and the like, while IPA has the characteristic that, because it is easily volatilized, it is easily purged by gas. Accordingly, it is preferable that IPA is used as a cleaning agent and TMAH is used as a deactivation agent.

In the present embodiment, the second liquid supply system is constructed by two supply systems, namely, the cleaning agent supply system 52 and the deactivation agent supply system 92, however, if the cleaning agent is also able to function as a deactivation agent, then the cleaning agent is made to double as the deactivation agent and the second liquid supply system can be constructed by one of the cleaning agent supply system 52 and the deactivation agent supply system 92, so that, thereafter, a cleaning agent that also functions as a deactivation agent can be supplied to the liquid material supply system 50. If a plurality of types of cleaning agent and deactivation agent are prepared, then naturally it is also possible for the second liquid supply system to be formed not by two systems but by three or more systems.

Moreover, in the present embodiment, the cleaning agent supply system 52 and the deactivation agent supply system 92 are both connected to a top portion of the liquid material container 51 of the liquid material supply system 50, so that cleaning agent or deactivation agent can be supplied to the entire liquid material supply system 50, namely, the liquid material container 51, the MFC 57, the nozzle 53, the chamber 40, and the pipes 56 that link these. However, the present invention is not limited to this, and it is possible for the connection point to be provided at an optional location such that liquid can be supplied to an optional location of the liquid material supply system 50, which is the first liquid supply system. Specifically, it is possible for the connection to be made between the second valve V2 and the MFC 57 so that liquid can be supplied to the MFC 57 and portions downstream therefrom. Alternatively, the connection can be made between the third valve V3 and the nozzle 53 so that liquid can be supplied to the nozzle 53 and portions downstream therefrom.

In the embodiment shown in FIG. 3, because the cleaning agent supply system 52 and the deactivation agent supply system 92 are connected between the first valve V1 and the liquid material container 51 so that cleaning agent and deactivation agent can be transferred to the liquid material container 51, if usable liquid material remains in the liquid material container 51, cleaning processing or deactivation processing cannot be performed if this liquid material is left as it is. Therefore, by connecting the cleaning agent supply system 52 and the deactivation agent supply system 92 below the second valve V2, cleaning processing and deactivation processing of the liquid material supply system 50 can be performed regardless of whether or not liquid material is remaining in the liquid material container 51.

Note that, in particular, if a plurality of second liquid supply systems are provided, it is also possible to connect one directly to the chamber 40, so that cleaning processing or deactivation processing can be performed directly on the interior of the chamber 40.

It is also preferable that a filter be provided on the path to the liquid material supply system 50 so that foreign matter or solid portions formed by hardened liquid material that are present in the liquid material can be prevented from being coated on the substrate W. If a filter is provided for a purpose such as this, then it is particularly preferable that it be provided at the distal end side (i.e., the discharge side) of the nozzle 53 so that foreign matter and the like can be more reliably prevented from being coated on the substrate W.

The purge mechanism 47 is connected between the second valve V2 of the liquid material supply system 50 and the MFC 57, and is constructed by a pipe 64 that links the gas introduction section 63 that introduces gas to the purge mechanism 47 with the pipe 56 of the liquid material supply system 50, and by an eleventh valve V11 that is provided on the pipe 64.

The purge mechanism 54 is connected between the nozzle 53 of the liquid material supply system 50 and the third valve V3, and is constructed by a pipe 62 that links the gas introduction section 61 that introduces gas to the purge mechanism 54 with the pipe 56 of the liquid material supply system 50, and by a sixth valve V6 that is provided on the pipe 62.

The purge mechanisms 47 and 54 are provided in order to supply the path with an inert gas such as nitrogen that is introduced from the gas introduction sections 61 and 63 and replace the liquid material on the path with the inert gas, or in order to remove foreign matter that may cause the liquid to form lumps, in particular, in cases such as when organic solvent vapor from the liquid material remains on the path, or so as to prevent the liquid from forming lumps due to hardening of the liquid material or due to the volatility of the organic solvent in the liquid material or the like.

The waste liquid processing system 43 is constructed so as to include a cover 70 that is positioned in the chamber 40 so as to cover the outer periphery and bottom surface portion of the substrate stage 41 and that collects liquid material scattered by the rotation force of the substrate stage 41, a primary container 71 that is connected to the cover 70 and that temporarily stores liquid material collected by the cover 70, and a secondary container 72 that is linked via a seventh valve V7 to the first container 71. The secondary container 72 is able to be removed after the seventh valve V7 has been shut. The cover 70 is constructed so as to double as a portion for receiving unintentional drips of liquid from the nozzle 53 and dummy drips that are used to confirm the drip quantity from the nozzle 53. Note that this waste liquid processing system 43 constitutes the waste solution collection mechanism of the present invention.

In the same way as for the above described preprocessing section 20, the gas supply system 44 is constructed so as to be able to appropriately select either oxidizing gas, reducing gas, or inert gas and supply it to the interior of the chamber 40.

The exhaust system 45 is constructed so as to include a vacuum apparatus (not shown) such as a dry pump, and controls a variable valve (not shown) in accordance with the quantity of gas supplied to the interior of the chamber 40, and maintains the pressure inside the chamber 40 at substantially atmospheric pressure. Furthermore, the exhaust system 45 also has the role of expelling the atmospheric gas with which the chamber 40 has been temporarily filled when a substrate W that has undergone processing is moved to another processing chamber, and then subsequently introducing an inert gas into the interior of the chamber 40 using the gas supply system 44 so that oxidizing gas contained in the atmospheric gas and organic gases generated from the liquid material are prevented from leaking to other processing chambers.

An adjusting apparatus that adjusts the concentration of each gas in the atmospheric gas, for example, the oxygen concentration is also provided in the chamber 40. As a result, the concentration of each gas such as the oxygen concentration can be adjusted as is desired. As a result of this structure, the chamber 40 is able to maintain an oxygen concentration and a concentration of oxides such as water in the interior thereof of 10 ppm or less, and actually of 1 ppm or less. Note that a pressure sensor (not shown) that detects pressure inside the chamber 40, and an atmosphere sensor that detects the gas type and concentration thereof of the processing atmosphere are installed in the chamber 40. By feeding outputs from these sensors back to the gas supply system 44 and the exhaust system 45, more accurate atmosphere control can be performed. Moreover, as a result of this type of precise atmosphere control being performed, it is possible to improve the film quality of the thin film being formed. It is preferable that the aforementioned pressure sensor and atmosphere sensor and the like are provided at a top portion side within the chamber 40. If these are provided at the top portion side, it is possible to prevent liquid material from adhering to the sensor and thereby contaminating the sensor and reducing its functionality.

When coating a substrate W with liquid material using the coating section 21 having the above described structure, namely, the coating apparatus of the present invention, the substrate W is vacuum adhered onto the substrate stage 41, and liquid material is dripped onto the substrate W from the nozzle 53. After the liquid material has been temporarily stored in the liquid material container 51, if the interior of the liquid material container 51 is pressurized by the introduction thereinto of an inert gas such as nitrogen gas from the gas introduction section 55, the liquid material is forced out from the interior of the liquid material container 51. The liquid material is then discharged from the nozzle 53 while the flow rate thereof is adjusted by the MFC 57, and is coated onto the substrate W. The coated liquid material spreads over the center portion of the substrate W, and is drawn over the entire surface of the substrate W by the rotation of the substrate stage 41 so as to form a coating film.

At this time, the liquid material that has not stayed on the substrate W so as to become coating film is scattered towards the outer peripheral portions of the substrate stage 41 by the rotation force of the substrate stage 41. Scattered liquid material is collected by the cover 70 provided inside the chamber 40, and is then introduced into the primary container 71 where it is temporarily stored. When the seventh valve V7 is opened and the interior of the secondary container 72 is depressurized, the liquid material that is accumulated in the primary container 71 is introduced into the secondary container 72. The portion of pipe from the cover 70 to the secondary container 72 is inclined along its entire length. Accordingly, because liquid material gathered by the cover 70 is able to reach the secondary container 72 due to its own gravity, it can be more efficiently collected in a waste solution container. By removing the secondary container 72 after the seventh valve V7 has been closed, disposal processing and the like can be performed on the liquid material inside the secondary container 72. Note that it is desirable that the task of moving the liquid material from the primary container 71 to the secondary container 72 is performed in the period while the coating film is being formed. By employing such a method, it is possible to prevent the waste solution atmosphere from affecting the coating film. Moreover, because a liquid that contains an organic solvent is accumulated in the secondary container 72, it is desirable that an exhaust system be connected to this secondary container 72. In this case, it is also possible to connect the exhaust system 46 to the secondary container 72 via a valve.

Next, a description will be given of a method of cleaning the interior of the liquid material container 51 using the cleaning agent supply system 52 in cases such as when the spin coater of the coating section 21 is temporarily paused, when the type of liquid material is changed, or when the liquid material container 51 is emptied and has to be exchanged.

Firstly, the cleaning agent container 60 containing cleaning agent is attached to the pipe 59 of the cleaning agent supply system 52. After the liquid material inside the liquid material container 51 has been discharged so that the liquid material container 51 is substantially empty, the second valve V2 is closed. Next, the fourth valve V4 and the fifth valve V5 are opened, and an inert gas is introduced from the gas introduction section 58 so as to pressurize the interior of the cleaning agent container 60. As a result, cleaning agent is drawn out from the cleaning agent container 60 and flows into the liquid material container 51.

Here, for example, cyclosilane or the like for forming a silicon film is used as the liquid material. When the activeness of the cyclosilane cannot be dispelled by cleaning solution, instead of performing cleaning processing by supplying cleaning agent to the liquid material container 51 from the cleaning agent supply system 52, deactivation agent is supplied from the deactivation agent supply system 92 to the interior of the liquid material container 51 in the same way as from the cleaning agent supply system 52. As a result, the activeness of the liquid material remaining inside the liquid material container 51 is dispelled. Note that, after the activeness dispelling processing has been performed in this way, or, alternatively, prior to this processing, it is naturally also possible to allow cleaning agent to flow into the liquid material container 51 from the cleaning agent supply system 52 and to also perform cleaning processing.

When the spin coater 21 is temporarily paused, or when the type of liquid material is being changed or the like, in order to prevent the liquid from forming lumps inside the liquid material supply system 50, and, particularly, inside the nozzle 53 due to the volatility of organic solvents in the liquid material or due to hardening of the liquid material, the interior of the liquid material supply system 50 and, in particular, the interior of the nozzle 53 can be purged using the purge mechanism 47 or the purge mechanism 54. When this purge processing is performed, for example, by the purge mechanism 47, firstly, the second valve V2 is closed, then the eleventh valve V11 is opened so that inert gas is introduced from the gas introduction section 63. When this purge processing is performed by the purge mechanism 54, firstly, the third valve V3 is closed, then the sixth valve V6 is opened so that inert gas is introduced from the gas introduction section 61.

Using this type of coating apparatus (i.e., the coating section 21), because it is possible to clean or render harmless any remaining liquid material using the cleaning agent supply system 52 or the deactivation agent supply system 92, not only can tasks such as maintenance of the apparatus be safely performed, but thin films having few defects can be formed.

Furthermore, when a coating film is formed using a spin coating method, 90 percent or more of the dripped liquid material is scattered towards the periphery of the substrate W by the rotation of the substrate W. A portion thereof remains as it is within the chamber 40 and is dried so as to form a solid powder. In some cases, this powder then becomes a cause of defects when subsequent coating films are being formed. However, using the above described coating apparatus (i.e., the coating section 21), at the same time as remaining liquid material is rendered harmless it can also be guided to the waste liquid processing system 43. Therefore, it is possible to form thin films that have few defects.

There are also times when the chamber (i.e., the coating chamber) 40 must be opened to the air in order to perform maintenance or non-routine tasks. Because a large number of liquid materials are flammable and because some liquid materials are toxic and ignitable, maintenance and non-routine tasks can be hazardous. However, according to the above described coating apparatus, it is possible for these tasks to be performed safely.

Note that in the above described coating apparatus (i.e., the coating section 21), the nozzle 53 has two stop positions. Namely, a drip position where the liquid material is dripped onto the substrate W, and a wait position where liquid material is not dripped onto the substrate W, for example, when the substrate W is being transported or during a dummy discharge of the liquid material. It is preferable that the nozzle 53 is able to move between these stop positions and that this movement can be controlled. In this case, it is desirable that a liquid receiving portion be provided, in particular, at the wait position of the nozzle 53. It is desirable that the liquid receiving portion be constructed integrally with the cover 70, or that pipes be provided such that liquid material received by the liquid receiving section is guided to the waste liquid processing system 43.

By employing this type of structure, because the nozzle 53 is able to wait at the wait position, the nozzle 53 does not obstruct the entrance or exit of the substrate W into the chamber 40. Moreover, unnecessary liquid material can be prevented from dripping onto the substrate W from the nozzle 53. In addition, if a liquid receiving portion is provided at a wait position of the nozzle 53, it is possible to perform a dummy dripping before the liquid material is dripped onto the substrate W. Accordingly, by performing this dummy dripping prior to a coating operation sequence, the liquid material can be dripped with stability, and it is possible to ensure uniformity in the film quality and film thickness of the thin film that is obtained. Furthermore, cleaning agent and deactivation agent that are introduced to the liquid material supply system 50 by the cleaning processing and deactivation processing can be dripped at the wait position.

The waste liquid collection mechanism of the coating apparatus of the present invention is not limited to the above described waste liquid processing system 43 and any appropriate structure can be employed provided that it collects, as waste liquid, liquid that is no longer necessary after having been introduced into the chamber 40 (i.e., the coating chamber). For example, it is also possible to employ a structure that is provided with a waste liquid container and a waste liquid pipe that connects the waste liquid container with the chamber 40. The waste liquid pipe is positioned such that waste liquid inside the pipe flows in the direction of gravitational force, and has an isolation valve that isolates the waste liquid container and the chamber 40. The waste liquid container has an exhaust pipe for expelling gas inside the waste liquid container, a liquid measuring instrument (i.e., a liquid level gauge) that detects the quantity of liquid inside the waste liquid container, and a relief valve that opens so as to release pressure when the pressure inside the waste liquid container reaches a predetermined pressure or more.

If this type of structure is employed, it is possible to improve the safety of the waste liquid collection mechanism, and to form a thin film having an excellent film quality by doing away with any effects from the waste solution. Moreover, because a liquid measuring instrument (i.e., the liquid level gauge) is provided in the waste liquid container, it is possible to replace the container before it becomes full. Furthermore, because the waste liquid container is provided with an exhaust pipe and a relief valve, it is possible to safely expel gas from organic solvents and the like that have filled the container. If, by any chance, the pressure inside the container should rise, then it is also possible to prevent this pressure from rising above a predetermined pressure using the relief valve. Accordingly, the safety of the waste liquid collection mechanism is guaranteed.

Because the chamber 40 and the waste liquid container are connected by the waste liquid pipe that is not aligned in a horizontal direction, but in a vertical direction or on an inclination such that waste liquid is made to flow in the direction of gravitational force, liquid material, cleaning agent, and deactivation agent can be guided quickly to the waste liquid container. Furthermore, because an isolation valve is provided that shuts off the waste liquid collection mechanism from the chamber 40, when forming a coating film it is possible to block any effects from waste solution that may be present in the waste solution collection mechanism, and to prevent the film quality of the thin film from being damaged.

Figure 4:
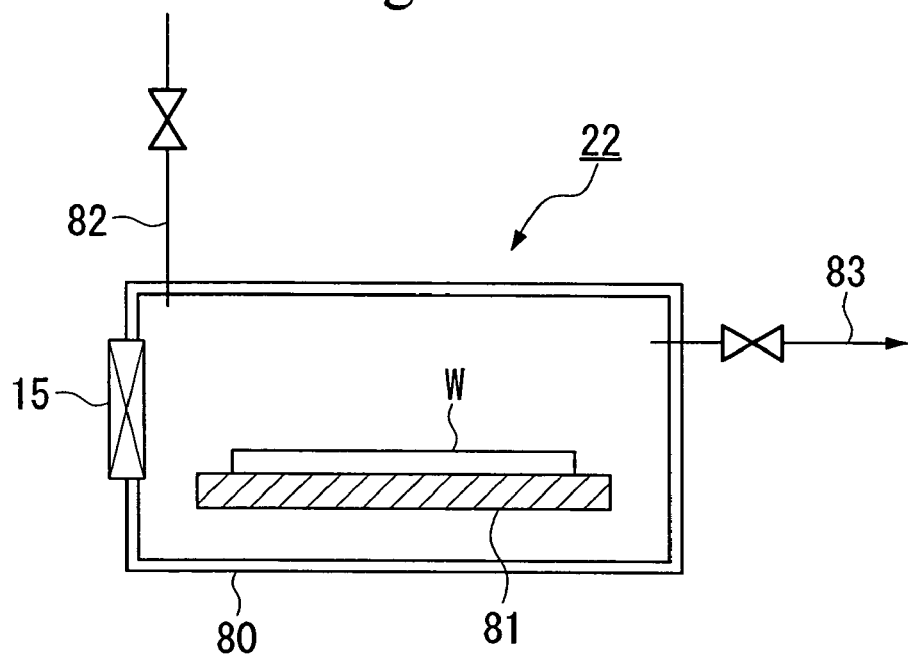
FIG. 4 is a schematic structural view of a first heat processing section.

FIG. 4 shows the schematic structure of the first heat processing section 22.

The first heat processing section 22 is connected to the connecting chamber 13 via a gate valve 15 as shown in FIG. 1 and is structured to include a chamber 80 that maintains an internal airtight atmosphere, a heating mechanism 81 that holds a substrate W and also heats the substrate W, a supply system 82 that supplies various types of atmospheric gas to the interior of the chamber 80, and an exhaust system 83 that expels gas from inside the chamber 80. A hot plate is preferably used as the heating mechanism 81. Solvent contained in the coating film on the substrate is removed by the heating of the heating mechanism 81, so that the film is able to be hardened. Note that it is possible to control the substrate temperature to a range of between 80 and 200° C. using this heating mechanism 81. It is also possible using the exhaust system 83 to keep the oxygen concentration as well as the concentration of oxides such as water inside the chamber 80 to 10 ppm or less and actually to 1 ppm or less. The supply system 82 that supplies various types of atmospheric gas to the interior of the chamber 80 and the exhaust system 83 that expels gas from the interior of the chamber 80 are the main component elements of the control mechanism that independently controls the first heat processing section 22, namely, controls the processing atmosphere inside the chamber 80.

Figure 5:
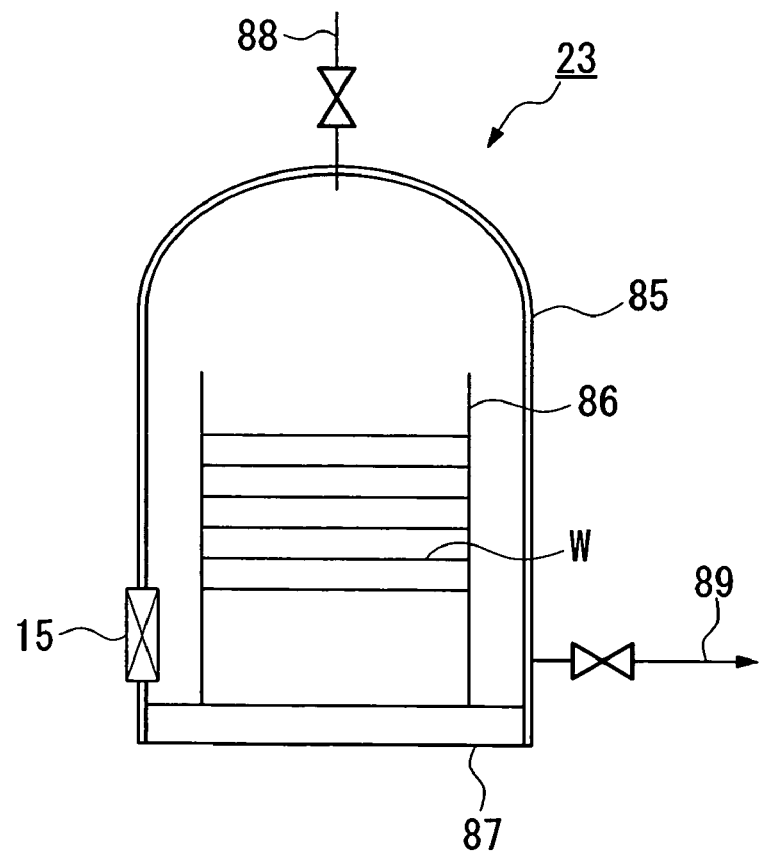
FIG. 5 is a schematic structural view of a second heat processing section.

FIG. 5 shows the schematic structure of the second heat processing section 23.

The second heat processing section 23 constitutes a heating furnace (a hot wall type) and is connected to the connecting chamber 13 via a gate valve 15 (see FIG. 1), and is constructed to include a quartz pipe (i.e., processing chamber) 85 that maintains an internal airtight atmosphere, a substrate holder 86 having a plurality of levels that is manufactured from quartz and holds a substrate W inside the quartz pipe 85, a susceptor 87 on which the substrate holder 86 is placed and which is provided with a heating mechanism (not shown) and a vertical movement mechanism, a supply system 88 that supplies various types of atmospheric gas to the interior of the quartz pipe 85 and an exhaust system 89 that expels gas from inside the quartz pipe 85. By using this heating furnace to heat the substrate W at a higher temperature than the heating temperature inside the first heat processing section 22, the film quality of the coating film can be improved and a coating film having the desired film quality can be formed. Using the exhaust system 89, the oxygen concentration as well as the concentration of oxides such as water inside the furnace can be held to 10 ppm or less and actually to 1 ppm or less. Because the presence of oxygen often brings about a deterioration in the characteristics of the thin film in the case of a semiconductor film or metal film, it is desirable that the heat processing be performed in an atmosphere in which the oxygen and moisture concentrations are reduced as much as possible. However, when forming an insulating film or, in particular, an oxide film, in some cases the presence of oxygen and moisture are necessary to improve the film quality. Accordingly, in order to satisfactorily improve the film quality, the atmospheric gas may be selected depending on the thin film from an oxidizing gas, a reducing gas such as hydrogen gas, or an inert gas. In addition, the supply system 88 that supplies various types of atmospheric gas to the interior of the quartz pipe 85 and the exhaust system 89 that expels gas from the interior of the quartz pipe 85 are the main component elements of the control mechanism that independently controls the processing chamber of the second heat processing section 23, namely, controls the quartz pipe 85.

In the third heat processing chamber 24, although not shown in the drawings, laser annealing or lamp annealing are employed for the heating means. In this case, by performing the heating processing at a still higher temperature than the heating temperature in the second heat processing section 24, an even greater improvement in the film quality can be achieved. Note that, in the third heat processing section 24 as well, there is provided a supply system that supplies various types of atmospheric gas to the interior of the chamber (i.e., the processing chamber) and an exhaust system that expels gas from the interior of the chamber, and these are the main component elements of the control mechanism that independently controls the processing atmosphere inside the chamber.

The connecting chamber 13 is provided with a control apparatus (i.e., a control mechanism) that controls the atmospheric gas in the interior thereof. The connecting chamber 13 is able to keep a substrate W in a desired atmosphere without exposing it to the air when the substrate W is moved from, or is temporarily held in, the respective chambers (i.e. the processing chambers) of the respective processing sections 20 to 24 to another processing section. The control apparatus (i.e., the control mechanism) has a supply apparatus that selects an atmospheric gas and also supplies the selected gas, and an exhaust apparatus formed by a dry pump or the like. By supplying a sufficiently pure inert gas (for example, nitrogen gas), then, together with the action of the exhaust apparatus, the concentration of oxygen or of oxides such as water in the atmospheric gas inside a predetermined processing chamber can be controlled to 10 ppm or less and actually to 1 ppm or less. Furthermore, in order to prevent the increase of air from outside the apparatus, it is desirable that the pressure inside each section of the processing section 11 and inside the connecting chamber 13 be constantly maintained at a higher pressure than the atmospheric pressure. In addition, although not shown in the drawings, a cryopump is provided in addition to the dry pump of the exhaust apparatus in the connecting chamber 13. This allows the maximum amount of moisture in the atmospheric gas of a predetermined processing chamber to be removed when necessary.

Here, by providing auto pressure controllers (APC) in each of the connecting chamber 13 and in each section of the processing section 11, it is possible to control the atmosphere and pressure of each section independently.

Note that a control apparatus, namely, a control mechanism that includes a supply apparatus that selects an atmospheric gas and also supplies the selected gas, and an exhaust apparatus that is constituted by a dry pump or the like may be provided respectively for each of the aforementioned sections 20 to 24. Alternatively, it is also possible to independently control the pressure and atmosphere of each section 20 to 24 via the APC using the control apparatus of the connecting section 13.

By employing the above described structure, the apparatus structure is simplified markedly, in comparison with a conventional CVD apparatus, resulting in the cost of the apparatus being reduced considerably. Moreover, the throughput is higher and maintenance is simplified compared with a CVD apparatus, so that the flexibility of the apparatus is greater. In a CVD apparatus, a thin film is formed on the internal wall of the film forming chamber as well, and defects are generated when this thin film peels off, however, due to the structure of the present apparatus this problem is obviated.

In thin film formation that is based on the structure of the present invention, there are fewer items needing to be controlled compared with a conventional thin film forming apparatus and the control can be done using a more simple process. Therefore, thin films that are uniform and have high reproducibility can be formed. In a conventional apparatus, there are an extremely large number of control items such as the flow rates and proportions of a plurality of gases, pressure, substrate temperature, plasma power, distance between electrode and substrate, and the like. In contrast, in thin film formation according to the present invention, the only items to be controlled are the coating conditions (e.g. the revolution rate and revolution time of the spin coater) and the heat processing conditions (i.e., the temperature and time) as well as the atmosphere inside each processing chamber.

Moreover, because each section of the processing section 11 and the atmospheric gas inside the connecting chamber 13 can each be independently controlled by a control apparatus provided, for example, in the connecting chamber 13, it is possible to control the atmospheric gas during each step to the desired atmosphere. Accordingly, it is possible to form a thin film having desired characteristics such as it being possible to restrict the content of oxides in a thin film that is obtained to an absolute minimum.

Furthermore, by providing the cleaning agent supply system 52, the deactivation agent supply system 92, and the waste liquid processing system 43 in the coating section 21, maintenance of the apparatus can be performed efficiently, and the performance of the apparatus can be improved, and a reduction in the cost of a manufactured product can be achieved thanks to the improved performance.

(Method for Forming a Coated Conducting Film)

Next, a method of forming a coated conducting film by coating a liquid material containing electroconductive particles will be described.

This coated conducting film can be formed using the thin film forming apparatus shown in FIG. 1. In this case, as the liquid material, a material obtained by dispersing fine particles of an electroconductive substance such as metal in, for example, an organic solvent is used. For example, a material obtained by dispersing fine particles of silver (Ag) having a particle diameter of 8 to 10 nm in an organic solvent such as terpineol or toluene is coated on a substrate using a spin coating method. Alternatively, a coating film can be formed on a substrate in a predetermined pattern using a droplet discharge method.

Next, after volatile components in the coating film have been removed in the first heat processing section 22, further heat processing is performed at approximately 250 to 300° C. in the second heat processing section 23, so that an electroconductive film having a film thickness of approximately several hundred nm can be obtained. Other materials that may be used for the fine particles of the electroconductive substance include Au, Al, Cu, Ni, Co, Cr or indium tin oxide (ITO), so that an electroconductive film can be formed using the above described thin film forming apparatus. As a result, an electroconductive film of a thin film transistor (TFT) and metal wiring formed on a circuit substrate can be manufactured at low cost using the present invention.

The resistance value of a coated electroconductive film may be approximately 10 times greater than the bulk resistance value. Therefore, it is preferable that, in the third heat processing section 24, the coated electroconductive film undergoes further heat processing for several tens of minutes at approximately 300 to 500° C. so as to lower the resistance value of the electroconductive film. If the heat processing time is several seconds or less or several microseconds or less, it is possible also to perform the heat processing at an even higher temperature without affecting the thin film device or substrate. By performing heat processing such as this, for example, contact resistance between a TFT source region and source wiring formed by a coated electroconductive film, and also contact resistance between a drain region and a drain electrode formed by a coated electroconductive film can be reduced. Namely, by performing heat processing such as laser annealing or lamp annealing at a high temperature for short length of time in the third heat processing section 24, it is possible to more effectively lower the resistance of the coated electroconductive film and reduce the contact resistance. Moreover, reliability can be improved thanks to multilayer formation using different types of metals. Note that because base metal films such as those of Al and Cu are comparatively easily oxidized in air, it is preferable that metal films that are not easily oxidized in air, like those of noble metals such as Au and Ag, are formed.

(Method for Forming a Coated Insulating Film)

Next, a method of forming a coated insulating film will be described.

The coated insulating film can be manufactured using the apparatus shown in FIG. 1. Polysilazanes (this is a generic term for high polymers having a Si—N bond) are an example of a liquid that forms an insulating film when it undergoes heat processing after being coated. One polysilazane is [SiH$_2$NH]n (wherein n is a positive integer), and is called polyperhydrosilazane. This product is manufactured by Clariant (Japan), Ltd. Note that if the H in [SiH$_2$NH]n is substituted by an alkyl group (for example, a methyl group or an ethyl group or the like), an organic polysilazane is formed which is differentiated from inorganic polysilazane. In the present embodiment, it is preferable that inorganic polysilazane be used. The polysilazane is mixed with a liquid such as xylene and is spin coated on a substrate.

Spin on glass (SOG) film is an example of a material that forms an insulating film by undergoing heat processing after being coated. This SOG film has a siloxane bond as the basic structure thereof, and there are organic SOG that has an alkyl base and inorganic SOG that does not have an alkyl base. Alcohol or the like is used as the solvent for the SOG film. An SOG film is used as an interlayer insulating film for LSI for flattening purposes. An organic SOG film is easily etched by oxygen plasma processing, while an inorganic SOG film has the drawback that cracks are easily generated therein even when the film has a film thickness of several hundred nm. Consequently, as a single layer, it is almost never used for an interlayer insulating film, and is used as a flattening layer above or below a CVD insulating film.

In contrast, polysilazane is highly resistant to cracking, and is resistant to oxygen plasma, and, even as a single layer, is capable of being used as a reasonably thick insulating layer.

After a substrate on which the liquid material has been coated has undergone heat processing in the first heat processing section 20 so as to remove volatile components from the coating film, the substrate is transported to the second heat processing section 23. Here, the substrate undergoes heat processing for approximately 10 to 60 minutes at a temperature of approximately 300 to 500° C. in an oxygen or water vapor atmosphere so that the liquid material is transformed into SiO$_2$. Here, if the insulating film being formed is, for example, a gate insulating film, then because a gate insulating film is an extremely important insulating film that has an influence on the electrical characteristics of a TFT, it is necessary to control the boundary characteristics thereof with a silicon film at the same time as controlling the film thickness and film quality. Accordingly, in the substrate cleaning performed in the preprocessing section in which the surface condition of the silicon film is cleaned before the insulating film coating is formed, and in the third heat processing section 24, it is desirable that, after the above described heat processing in the second heat processing section 23, heat processing be performed for short time at a higher temperature than the heat processing temperature in the second heat processing section 23 using laser annealing or lamp annealing.

(Method for Forming a Coated Silicon Film)

Next, a method of forming a silicon film as a semiconductor film will be described.

This silicon film can be manufactured using the thin film forming apparatus shown in FIG. 1. Cyclosilane is an example of a liquid that forms a silicon film by undergoing heat processing after being coated. Other liquid materials that can be used for forming a silicon film in the present invention include solutions having as an essential component a silicon compound having a ring system represented by normal SinXm (here, n represents an integer of 5 or more, m represents an integer of n or 2n–2 or 2n, and X represents a hydrogen atom and/or a halogen atom). It is also possible for a silicon compound such as n-pentasilane, n-hexasilane, and n-heptasilane to be contained in the solution.

After the solvent has been removed therefrom in the first heat processing section, a substrate on which the liquid material has been coated by the coating section 21 then undergoes heat processing at a temperature of approximately 300 to 500° C. in the second heat processing section 23, so that a metal silicon film is formed thereon. Further heat processing is then performed in the third heat processing section 24. This heat processing is performed for a short time at a high temperature using laser annealing or lamp annealing, so that a silicon film having good crystallinity is formed. In the laser annealing, melting crystallization of the silicon film occurs, while in lamp annealing, solid-phase crystallization at high temperature occurs. By performing heat processing for a short time at a high temperature in this manner, it is possible to improve the crystallinity, compactness, and adhesion to other films of the silicon film compared with when heat processing is performed only in the second heat processing section 23.

Second Embodiment

Figure 6:
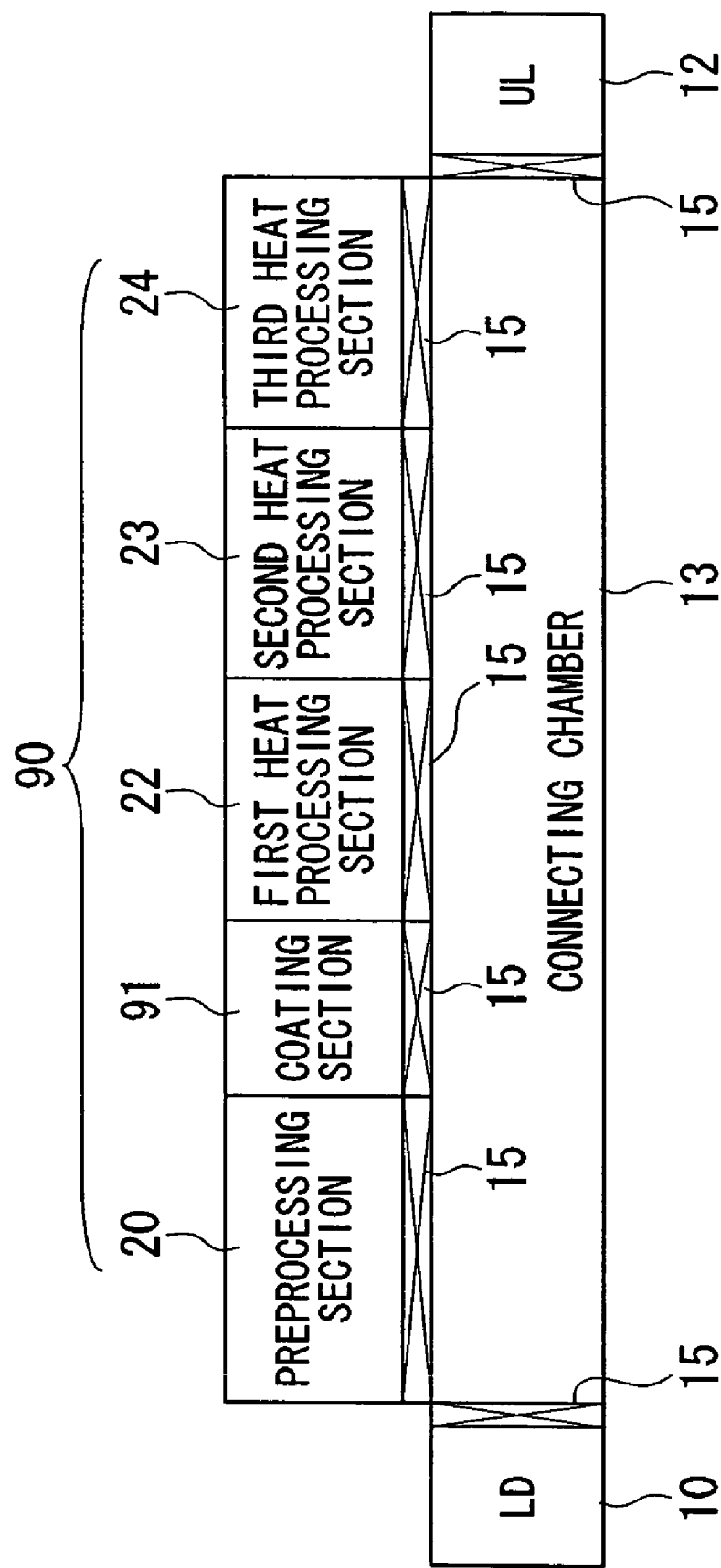
FIG. 6 is a schematic structural view showing a thin film forming apparatus according to a second embodiment of the present invention.

FIG. 6 is a view showing a second embodiment of the thin film forming apparatus of the present invention. Note that the same descriptors are given to structural elements in FIG. 6 that are the same as those shown in FIG. 1 and a description thereof is omitted.

In the thin film forming apparatus of the present embodiment, the basic structure is the same as that of the first embodiment shown in FIG. 1, however, in the coating section 91 (i.e., the coating apparatus) of the processing section 90 that coats liquid material on the substrate, namely, in the coating section 91 that forms another embodiment of the coating apparatus of the present invention, instead of coating the liquid material using a spin coating method, the liquid material is coated using what is known as an inkjet method.

Figure 7:
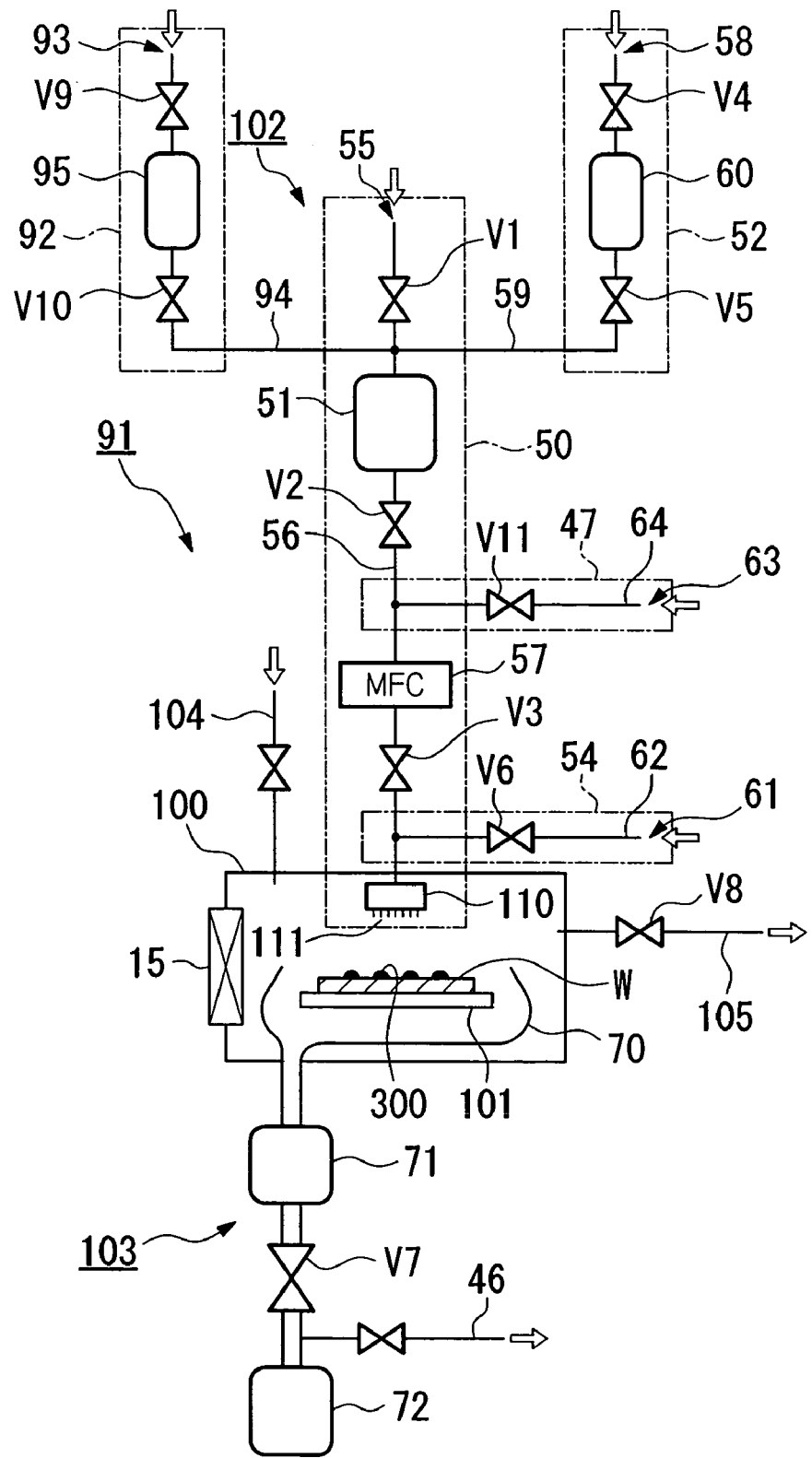
FIG. 7 is a schematic view of an inkjet processing section.

The schematic structure of the coating section 91 is shown in FIG. 7.

The coating apparatus that forms the coating section 91 is connected to the connecting chamber 13 via a gate valve 15, and is constructed by a chamber (coating chamber) 100 that maintains an airtight interior atmosphere, a substrate stage 101 that holds a substrate W, a liquid supply system 102 that supplies liquid material to the substrate W, a waste solution processing system 103 that secures scattered liquid material and collects it as waste liquid, a gas supply system 104 that supplies various types of atmospheric gas to the interior of the chamber 100, and an exhaust system 105 that expels gas from the interior of the chamber 100. Note that the supply system 104 that supplies various types of atmospheric gas to the interior of the chamber 100, and the exhaust system 105 that expels gas from the interior of the chamber 100 constitute the main component elements of a control mechanism that independently controls the processing atmosphere of the processing chamber of the coating section 91, namely, of the chamber 100.

Here, because the liquid supply system 102, the waste liquid processing system 103, the supply system 104, and the exhaust system 105 each have substantially the same structure as the liquid supply system 42, the waste liquid processing system 43, the supply system 44, and the exhaust system 45 that are provided in the coating section 21 shown in the first embodiment, a description thereof is omitted and only those points that are different from the coating section 21 are described.

In the coating section 91, liquid material is supplied from the liquid material container 51 to a dispenser head 110 via the MFC 57. The liquid material is then coated as an extremely large number of dots 300 on the substrate W from a plurality of nozzles 111 provided in the dispenser head 110. Here the dispenser head 110 is a droplet discharge section that discharges micro droplets. By moving the dispenser head 110 relatively to the substrate stage 101, micro droplets can be dripped onto predetermined positions of the substrate W that is held on the substrate stage 101. Note that the MFC 57 is not absolutely essential, and is not required provided that it is possible to discharge a predetermined quantity of micro droplets using the dispenser head 110.

Figure 8:
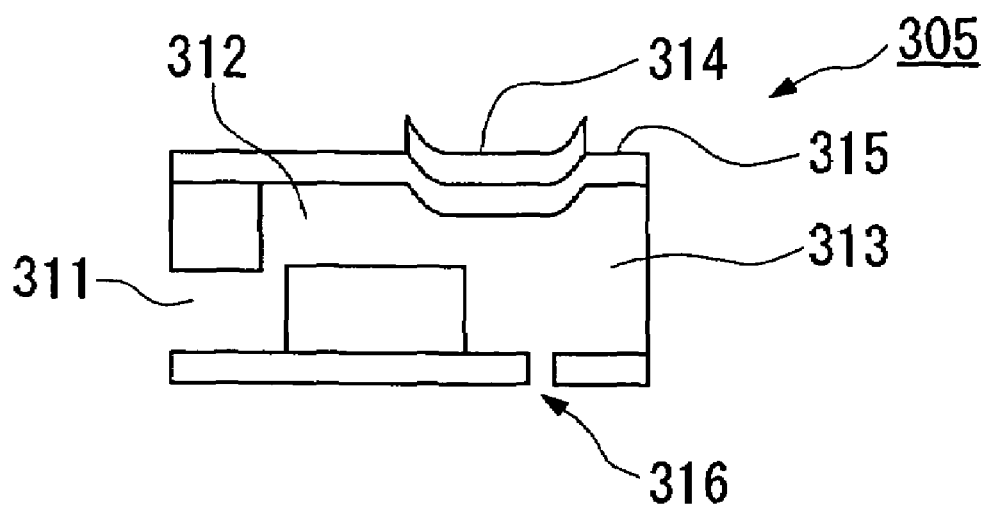
FIG. 8 is an enlarged side view of a portion of a dispenser head shown in FIG. 7.

FIG. 8 shows in detail a cross section of the dispenser head 110.

This dispenser head 110 has the same structure as the head of an inkjet printer, and is constructed so as to discharge a liquid material using the oscillation of a piezoelectric element. The liquid material is accumulated in a cavity section 313 from an entry aperture section 311 via a supply aperture 312. An oscillating plate 315 is moved by the elongation and contraction of a piezoelectric element 314 that is in close contact with the isolating plate 315, so that the volume of the cavity 313 is reduced or enlarged. As a result, when the volume of the cavity 313 is reduced, liquid material is discharged from a nozzle aperture 316. When the volume of the cavity 313 is enlarged, liquid material is supplied to the cavity 313 from the supply aperture 312. As is shown in FIG. 9, for example, a plurality of nozzle apertures 316 may be arranged two-dimensionally so that, as is shown in FIG. 7, by moving the substrate W relatively to the dispenser head 110, liquid material can be discharged onto a predetermined position of the substrate and a coating film can be formed in a predetermined configuration.

Figure 9:
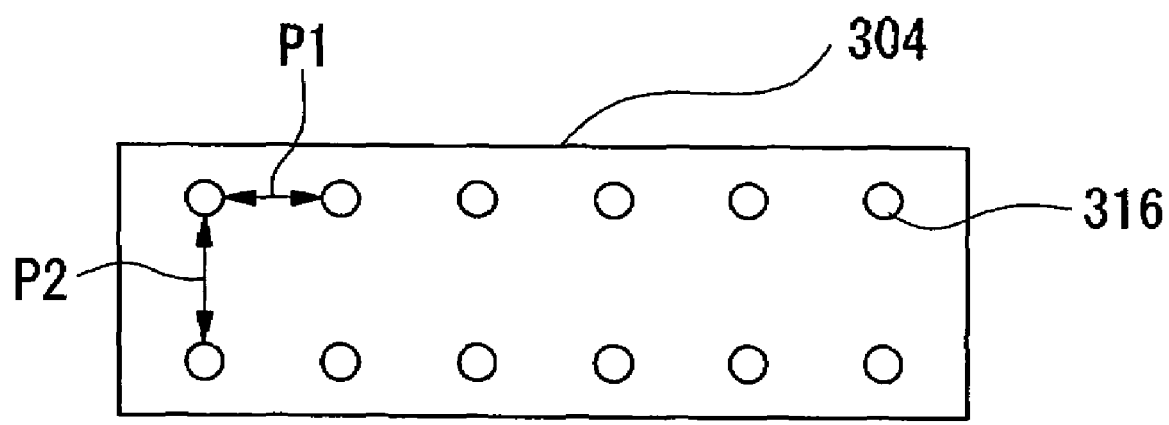
FIG. 9 is an enlarged bottom view of a portion of a dispenser head shown in FIG. 7.

In FIG. 9, the pitches of the nozzle apertures 316 are set such that the pitch P1 in the horizontal direction is several tens to several hundreds of μm, while the pitch P2 in the vertical direction is several mm. The aperture diameter of the nozzle apertures 316 is approximately several tens of μm to several hundred μm. The discharge quantity of a single discharge is several ng to several hundred ng, and the size of droplets of discharged liquid material is several μm to several hundred μm in diameter. A single droplet discharged from the nozzle 305 forms a circular pattern (i.e. a dot 300) having a diameter of several μm to several hundred μm on the substrate. By performing the discharge so that the pitch of the dots 300 is made smaller so that adjacent dots are made continuous with each other, a coating film can be formed on the substrate in a linear pattern or island pattern. Accordingly, in the formation of a thin film according to this method, because a required quantity of liquid material is coated on a required area, the efficiency of use of the material is increased markedly, enabling costs to be reduced. Moreover, because it is possible to do away with the process of etching the thin film there is neither any need for an etching apparatus, and problems in the base layer caused by over-etching and plasma damage that accompany the etching process are also obviated. Accordingly, it is possible to reduce costs and condense the manufacturing steps, and to also improve the device performance and manufacture devices of consistent quality.

Moreover, in this inkjet liquid coating method, it is also possible to form a coating film over the entire substrate surface. In order to achieve this, it is possible to narrow the interval between the dots 300 so as to form dots 300 that overlap each other, or to provide the stage 101 with a rotation mechanism so that liquid material formed in a dot configuration is spread over the entire surface of the substrate. Accordingly, the liquid material can be used efficiently. This method can also be applied to the formation of electroconductive films, insulating films, and semiconductor films that are formed by the coating film described in the first embodiment. Therefore, this method has an extremely large effect on reducing the cost of image display apparatuses and electronic instruments that use thin film devices that are formed having these thin films.

Third Embodiment

Figure 10:
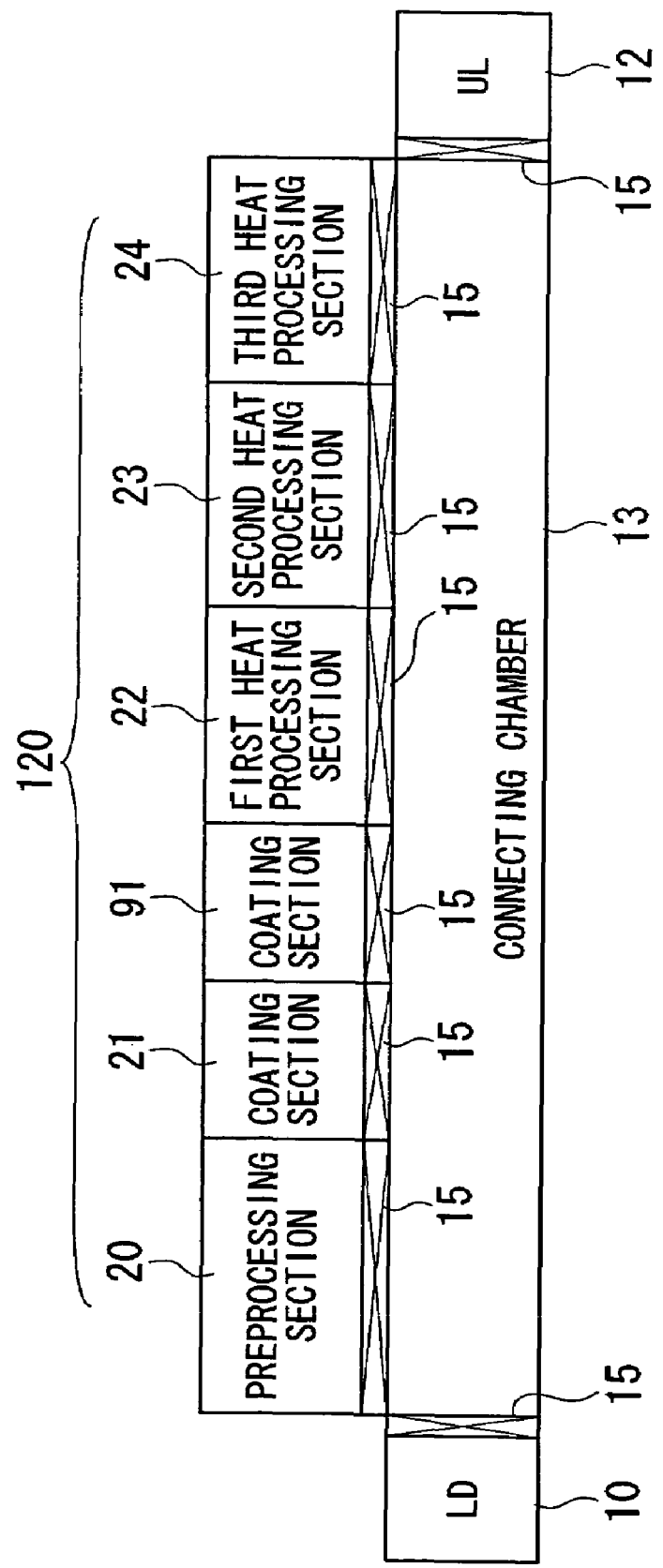
FIG. 10 is a schematic structural view showing a thin film forming apparatus according to a third embodiment of the present invention.

FIG. 10 is a view showing a third embodiment of the thin film forming apparatus of the present invention. Note that the same descriptors are given to structural elements in FIG. 10 that are the same as those shown in FIGS. 1 and 6 and a description thereof is omitted.

In the thin film forming apparatus of the present embodiment, the basic structure is the same as in the first and second embodiments shown in FIGS. 1 and 6, however, for the coating step in which a liquid material is coated on the substrate, in the processing section 120 there is provided both a coating section 21 (i.e., a coating apparatus) that coats a liquid material using a spin coating method and a coating section (i.e., a coating apparatus) 91 that coats a liquid material using an inkjet method.

By employing this type of structure, it is possible to select the method for coating the liquid material depending on the type and configuration of the thin film. For example, when a thin film is to be coated over the entire surface of a substrate, the coating can be performed efficiently using the spin coating method by the coating section 21. In contrast, when coating a liquid using the inkjet method by the coating section 91, it is possible to coat in a linear pattern having a width of several μm to several tens of μm. If this technology is used to form a silicon film or electroconductive film, then in the formation of a TFT thin film, for example, direct rendering that does not require a photolithographic step is made possible. If the TFT design rules are approximately several μm to several tens of μm, then by combining this direct rendering with the thin film forming technology of this coating method, it becomes possible to manufacture a liquid crystal display apparatus without using a CVD apparatus, a sputtering apparatus, an exposure apparatus, or an etching apparatus. Furthermore, by using a semiconductor material that has been doped with an impurity, there is also no need for ion punching and ion doping apparatuses.

Fourth Embodiment (Semiconductor Device Forming Method)

FIGS. 11A to 13C show the basic manufacturing steps for manufacturing a semiconductor device (for example, a TFT).

Figure 11A:
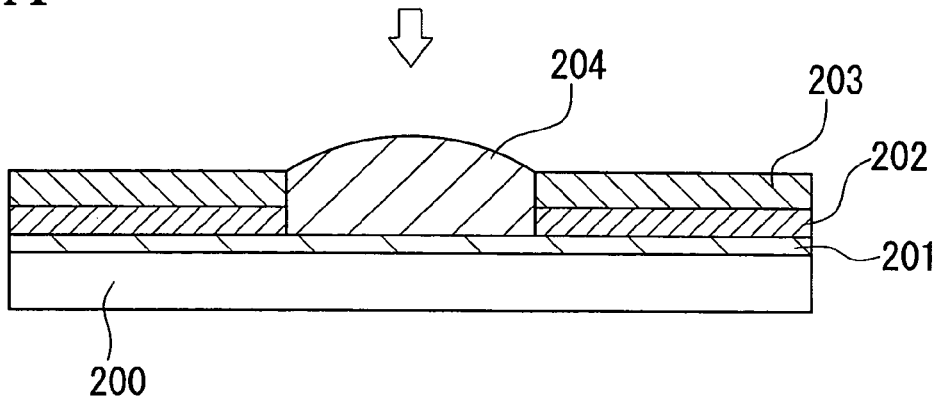
FIGS. 11A to 11C are views of manufacturing steps of a semiconductor device.

As is shown in FIG. 11A, a first insulating film (i.e., a base insulating film) 201 is formed on a silicon substrate 200. A second insulating film 202 is then formed on top of the first insulating film 201. The first insulating film 201 and the second insulating film 202 are both formed by coating a first liquid material obtained by mixing, for example, polysilazane in a solvent using a spin coating method, and then performing heat processing thereon so as to form $SiO_2$.

Next, the silicon film forming region is patterned using a photo-etching step. A first resist film 203 is then formed on the second insulating film 202, and the silicon film forming region of the second insulating film 202 is etched to match the pattern on the first resist film 203. If plasma containing fluorine is used for this etching of the insulating film, the resist surface is fluorinated so as to be furnished with liquid repellency. A second liquid material containing silicon atoms is then dripped onto the silicon film forming region using an inkjet method. Because the surface of the first resist film 203 is made more liquid repellant by the action of the plasma than the surface of the first insulating film 201 that is in contact with the second liquid material, the second liquid material is able to move smoothly onto the silicon film forming area. After the coating of the second liquid material is completed, organic solvent contained in the second liquid material is removed by heat processing. The temperature of this heat processing is approximately 150° C., and the heating time is approximately 5 minutes.

Figure 11B:
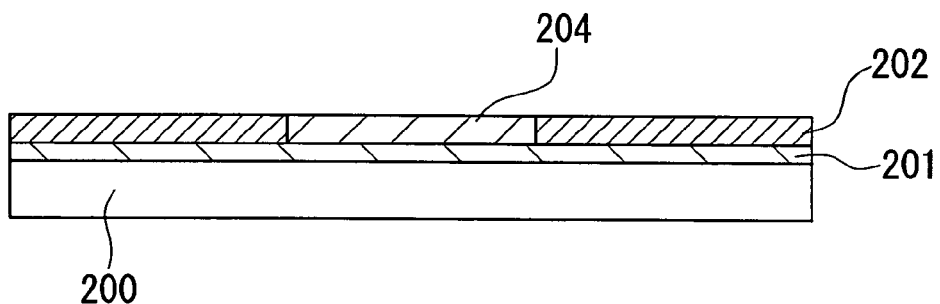

As is shown in FIG. 11B, after the heat processing, the first resist layer 203 is peeled off. Furthermore, as a result of the second heat processing, the silicon coating film is hardened and a silicon film 204 is formed. Note that if the resist is provided with heat resistance, then the first heat processing can be performed at a higher temperature, alternatively, the first resist film 203 can be peeled off after the second heat processing.

Figure 11C:
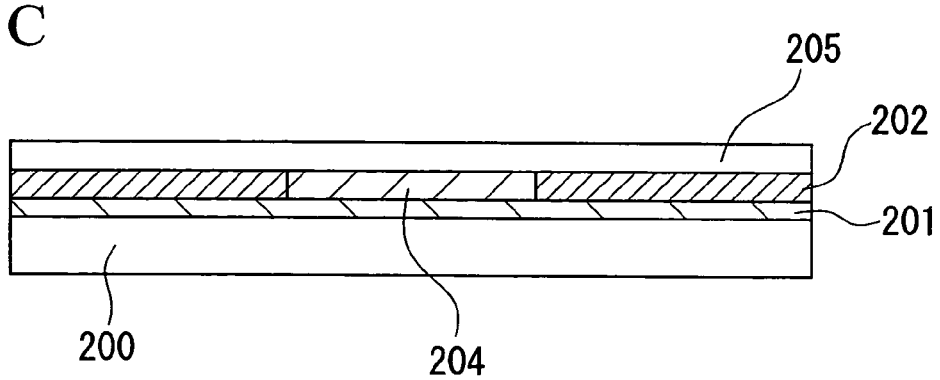

As is shown in FIG. 11C, after the silicon film 204 has been formed, a third insulating film 205, which constitutes a gate insulating film, is formed on top of the silicon film 204 and the second insulating film 202. In the same way as for the insulating film under it, the third insulating film 205 is formed by coating a first liquid material obtained by mixing, for example, polysilazane in a solvent using a spin coating method, and then performing heat processing thereon so that it is transformed into $SiO_2$.

Figure 12A:
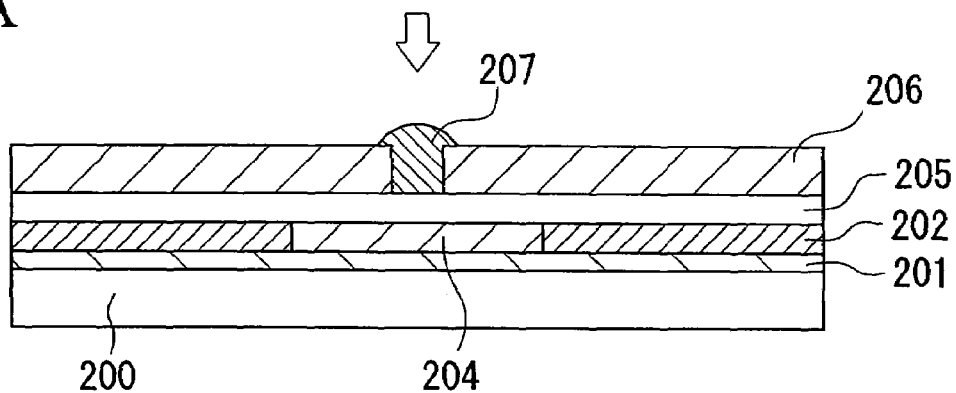
FIGS. 12A to 12D are views of manufacturing steps of a semiconductor device.

As is shown in FIG. 12A, after the third insulating film 205 has been formed, in the same way as is shown in FIG. 11A, a gate electrode region is patterned using a photo-etching step. A second resist film 206 is formed on top of the third insulating film 205, and the gate electrode forming region is patterned using a photo-etching step. Next, it is also possible to perform surface processing to render the resist surface repellent to liquid by processing the surface of the second resist film 206 by plasma using a fluorine-containing gas. After this surface processing, a third liquid material that contains particles of metal such as Ag or Cu is dripped onto the gate electrode forming region using a material discharge method. Because the surface of the second resist film 206 is furnished with liquid repellency by the fluoridizing action from the plasma processing, the third liquid material is able to travel smoothly onto the silicon film forming region. After the coating of the third liquid material has been completed, organic solvent contained in the third liquid material is removed by the first heat processing. The temperature of this first heat processing is approximately 150° C., and the heating time is approximately 30 minutes.

Figure 12B:
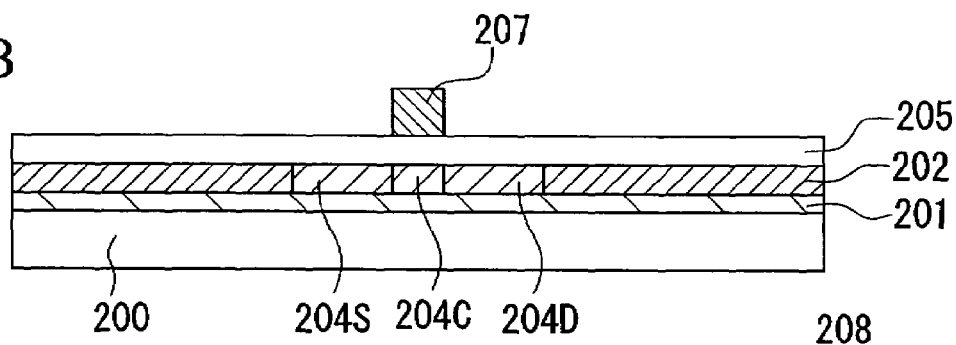

As is shown in FIG. 12B, after the first heat processing, the second resist film 206 is peeled off. By then performing the second heat processing the gate electrode film is made more compact and a gate electrode 207 is formed. After the gate electrode 207 has been formed, ion impurities are injected into the silicon film 204 so that, in the silicon film 204, a drain region 204D and a source region 204S that are doped at a high density with impurities, and a channel region 204C between the source region 204S and the drain electrode 204D are formed.

Figure 12C:
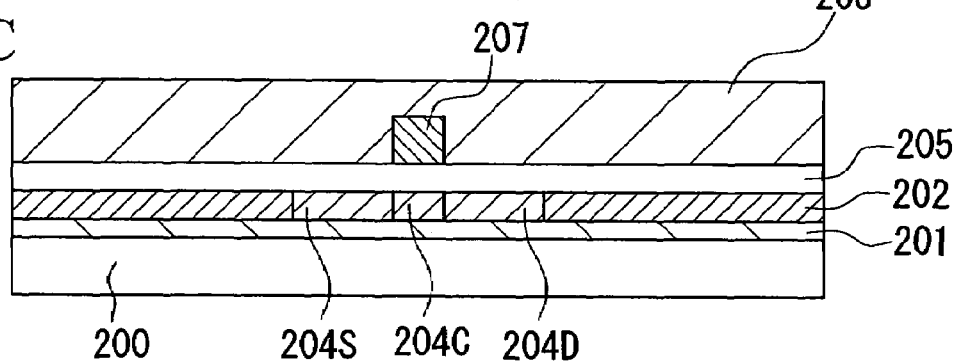

As is shown in FIG. 12C, after the injection of the impurities into the silicon film 204 is finished, a fourth insulating film 208, which is an interlayer insulating film, is formed on the third insulating film 205 and the gate electrode 207. In the same way as for the insulating film under it, the fourth insulating film 208 is formed by coating a first liquid material obtained by mixing, for example, polysilazane in a solvent using a spin coating method, and then performing heat processing thereon so that it is transformed into $SiO_2$. Here, further heat processing is applied so that each insulating film is made more compact and the injected impurities are activated.

Figure 12D:
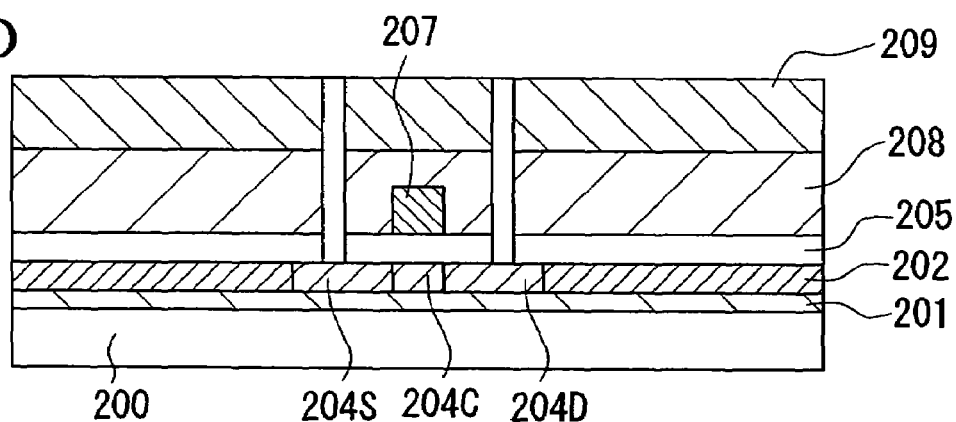

As is shown in FIG. 12D, a third resist film 209 used for forming contact holes is formed on the fourth insulating film 208. Contact holes are then opened up by etching as far as the surface of the silicon film 204.

Figure 13A:
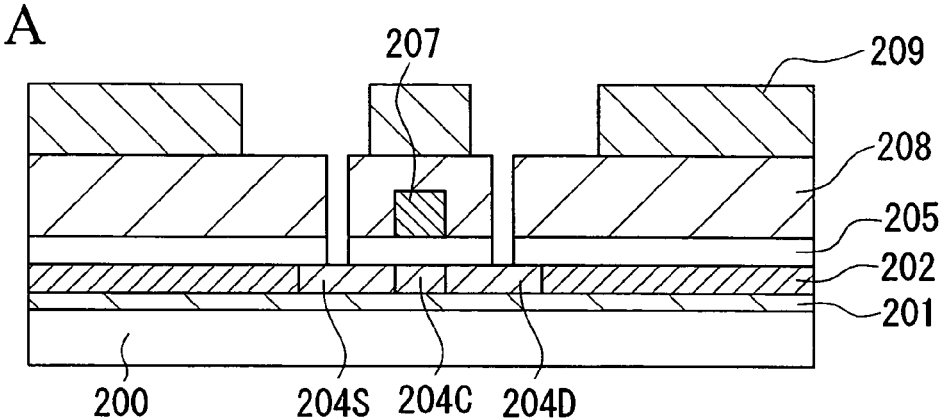
FIGS. 13A to 13C are views of manufacturing steps of a semiconductor device.

As is shown in FIG. 13A, after the contact holes have been formed, source electrode and drain electrode formation areas are formed by patterning by further exposing the top of the third resist film 209.

Figure 13B:
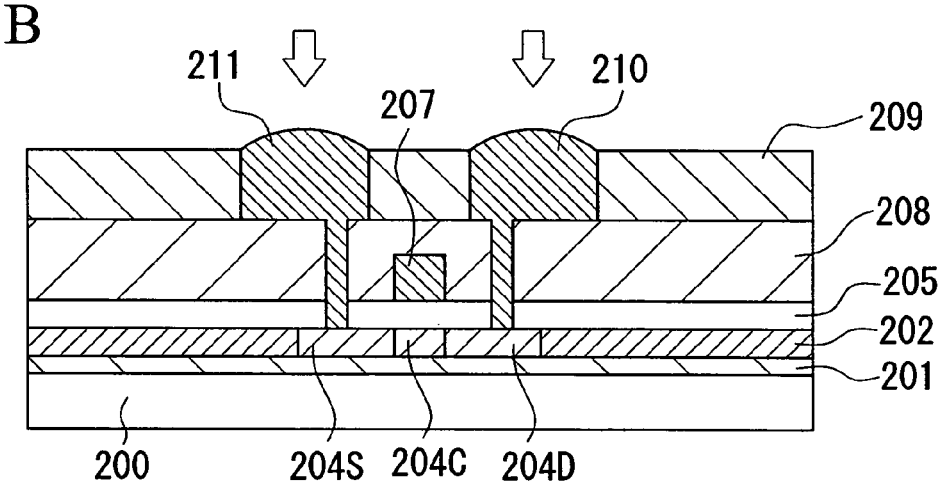

As is shown in FIG. 13B, after the electrode pattern region has been formed, a fourth liquid material that contains particles of metal such as Cu or Al is dripped onto both the gate and drain electrode forming regions using a material discharge method. Because the surface of the third resist film 209 is furnished with liquid repellency by the plasma processing, the fourth liquid material is able to travel smoothly onto each of the source and drain electrode regions. After the coating of the fourth liquid material has been completed, organic solvent contained in the fourth liquid material is removed by the first heat processing so that a solid metal film is formed. The heating temperature of this heat processing is approximately 150° C., and the heating time is approximately 30 minutes.

Figure 13C:
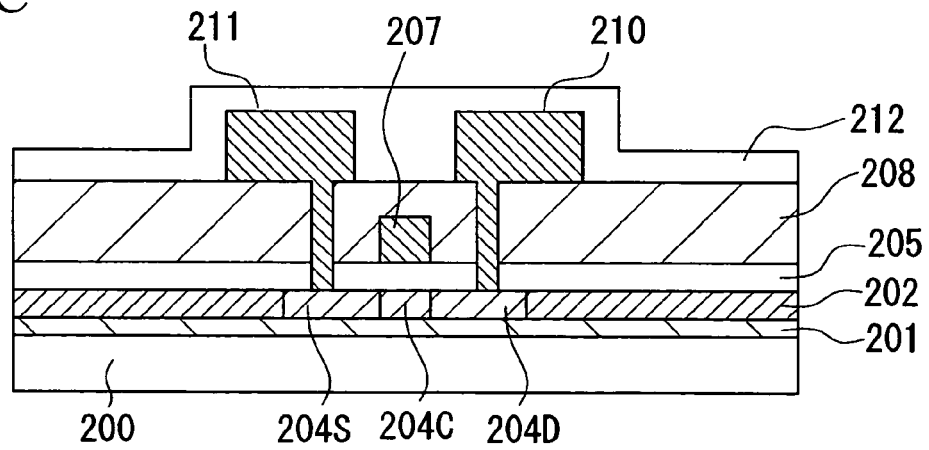

As is shown in FIG. 13C, after the heat processing, the fourth resist film 209 is peeled off. By then performing second heat processing the metal film is baked so that a low resistance source electrode 211 and drain electrode 210 are formed. After the electrodes have been formed, a protective layer (i.e., a protective insulating layer) 212 is formed as the topmost layer.

Note that in this fourth embodiment a description is given of a method of manufacturing a semiconductor device, however, the method may also be applied to TFT substrates that are active matrix substrates used in electro-optic devices, and other devices that use two terminal or three terminal elements as pixel switching devices in the same way, such as MIM (metal-insulator-metal) serving as active matrix substrates and MIS (metal-insulator-silicon). For example, a thin film stacking structure of an active matrix substrate that uses MIM is formed only by an electroconductive layer and an insulating layer and does not include a semiconductor layer, however, the present invention can be applied in this case as well.

Moreover, for example, the present invention can also be applied to the manufacturing of electro-optic devices such as organic EL devices and the like and to the manufacturing of normal LSI. In addition, the present invention can be applied also to thin film devices having a variety of thin film stacking structures that include a semiconductor layer other than that described above.

Fifth Embodiment (Electro-Optic Device)

Next, a description will be given of an organic electroluminescence (EL) device as an example of the electro-optic device of the present invention.

Figure 14:
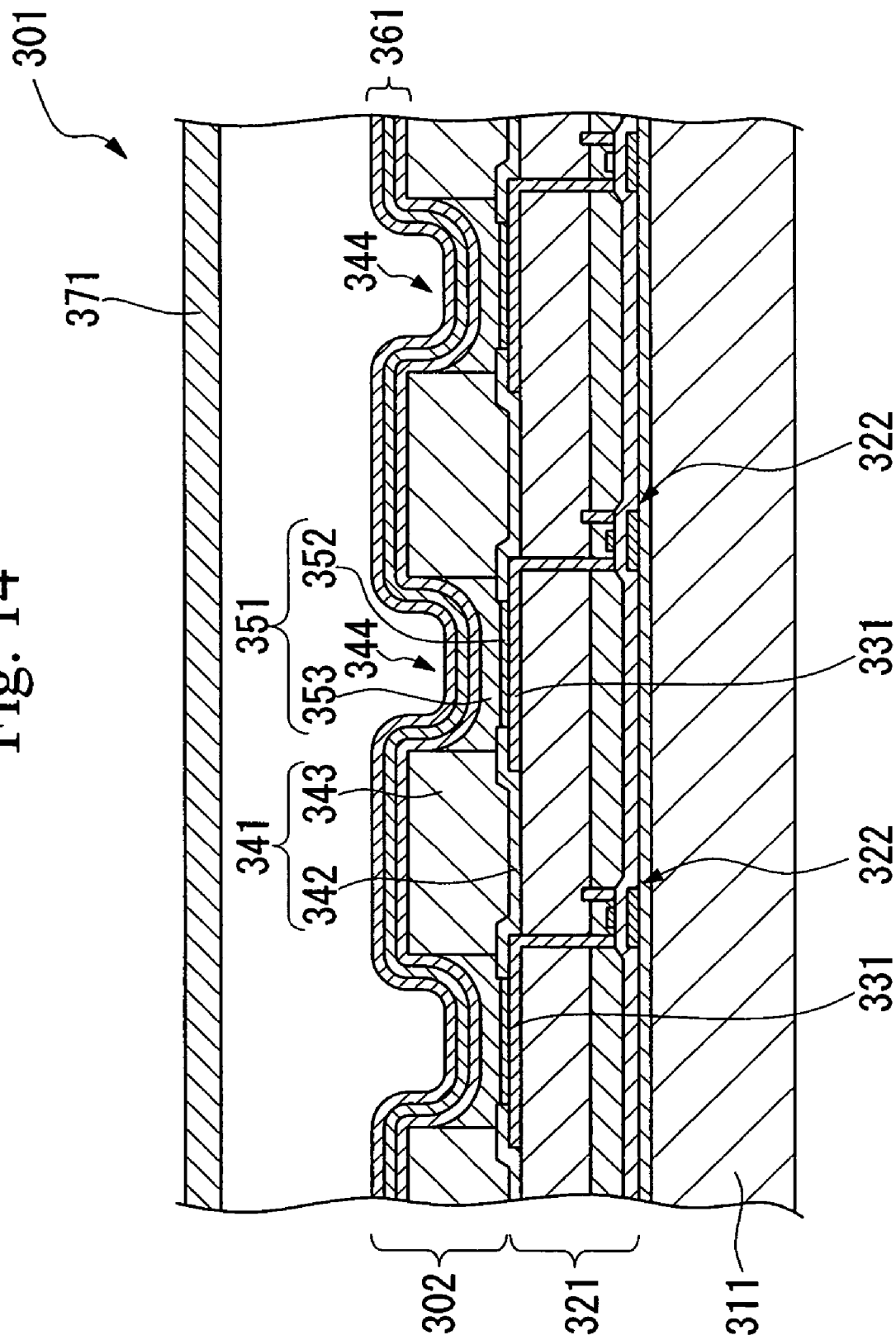
FIG. 14 is a side cross-sectional view of an organic EL apparatus.

FIG. 14 is a side cross-sectional view of an organic EL device having a semiconductor device formed by the above described thin film forming apparatus. Firstly, the schematic structure of this organic EL device will be described.

As is shown in FIG. 14, in the organic EL device 301 wiring of a flexible substrate (not shown) and a drive IC (not shown) are connected to an organic EL element 302 constructed by a substrate 311, a circuit element section 321, pixel electrodes 331, bank sections 341, light emitting elements 351, a cathode 361 (i.e., a counter electrode), and a sealing substrate 371. The circuit element section 321 is constructed by forming active elements 322 that are formed by a TFT or the like on the substrate 311, and then arranging a plurality of pixel electrodes 331 on the circuit element section 321. Here, a portion of the active elements 322 that are formed by TFT or the like are formed by the above described thin film coating apparatus, and, specifically, are formed by steps such as those shown in FIGS. 11A to 13C.

The bank sections 341 are formed in a matrix configuration between each pixel electrode 331, and the light emitting elements 351 are formed in concave openings 344 created by the bank sections 341. The cathode 361 is formed over the entire surface of the top portion of the bank sections 341 and the light emitting elements 351, and the sealing substrate 371 is formed on the cathode 361.

The manufacturing process to manufacture the organic EL device 301 that includes an organic EL element includes a bank section forming step to form the bank sections 341, a bank surface processing step suitable for forming the light emitting elements 351, a light emitting element forming step to form the light emitting elements 351, a counter electrode forming step to form the cathode 361, and a sealing step to protect the entire light emitting elements from the outside using the sealing substrate 371.

The light emitting element forming step involves forming the light emitting elements 351 by forming a positive hole injection layer 352 and a light emitting layer 353 in the concave openings 344 that are surrounded by the bank sections 341, namely, on the pixel electrodes 331, and includes a positive hole injection layer forming step and a light emitting layer forming step. The positive hole injection layer forming step includes a first discharge step in which a first composition of matter (i.e., a liquid) used for forming the positive hole injection layer 352 is discharged onto each of the pixel electrodes 331, and a first drying step in which the discharged first composition of matter is dried so as to form the positive hole injection layer 352. The light emitting layer forming step includes a second discharge step in which a second composition of matter (i.e., a liquid) used for forming the light emitting layer 353 is discharged onto the positive hole injection layer 352, and a second drying step in which the discharged second composition of matter is dried so as to form the light emitting layer 353.

In this organic EL device 301, a semiconductor device (TFT) such as that shown in the fourth embodiment is used as the active element 322 thereof. Accordingly, as this organic EL device 301 is provided with a low cost, high performance semiconductor device, the organic El device 301 itself also has a high level of performance.

Note that an electro-optic device to which the present invention is applied is not limited to that described above, and the present invention may also be applied to a variety of apparatuses such as, for example, to an electrophoresis apparatus and a liquid crystal display device, or to a plasma display device.

Sixth Embodiment (Electronic Instrument)

A specific example of the electronic instrument of the present invention will now be described as the sixth embodiment.

Figure 15:
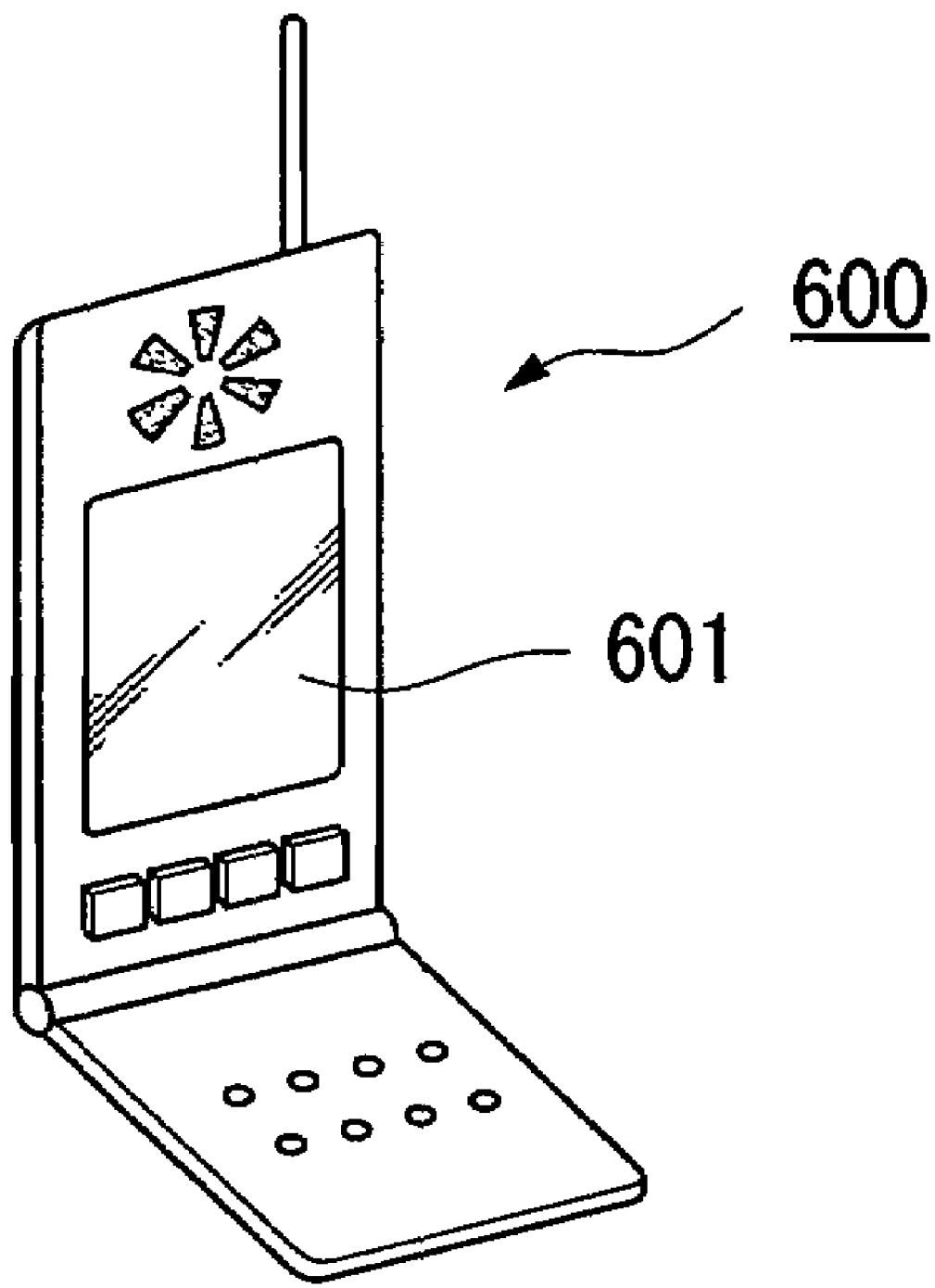
FIG. 15 is a perspective view showing an example of an electronic instrument according to a fifth embodiment of the present invention.

FIG. 15 is a perspective view showing an example of a mobile telephone.

In FIG. 15, 600 indicates a mobile telephone body inside which is provided a semiconductor device manufactured using the method of the fourth embodiment. 601 indicates an organic EL device that is also provided with a semiconductor device manufactured using the method of the fourth embodiment in the same way.

The electronic instrument (i.e., the mobile telephone) shown in FIG. 15 is provided with the semiconductor device or organic EL device of the above described embodiments. By providing the electronic instrument with a high performance semiconductor device, the electronic instrument itself is also furnished with a high level of performance.

Note that the present invention may also be applied to a variety of electronic instruments such as a word processor, personal computer, and wristwatch type electronic instrument in addition to the above described mobile telephone.

The coating apparatus, thin film forming method, thin film forming apparatus, semiconductor device manufacturing method, electro-optic device, and electronic instrument of the present invention have been described above, however, the present invention is not limited to these embodiments and various design modifications my be freely made insofar as they do not depart from the scope of the present invention.

Figure 16:
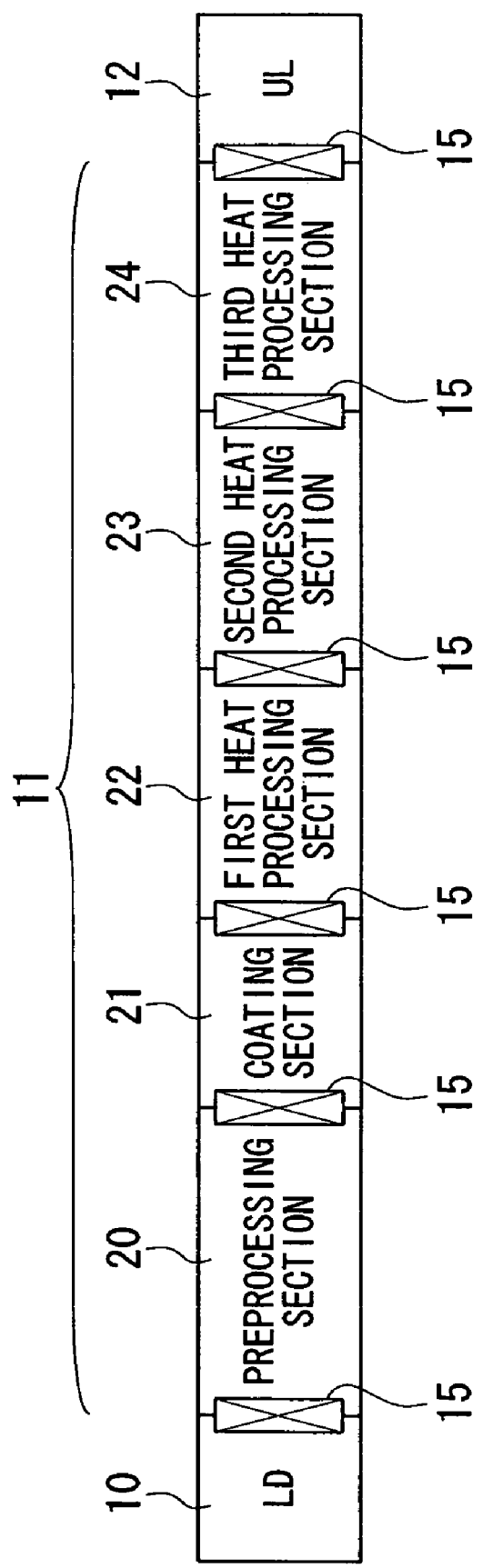
FIG. 16 is a schematic structural view showing a thin film forming apparatus according to another embodiment of the present invention.

For example, in the thin film forming apparatus of the first embodiment, as is shown in FIG. 1, a structure is employed in which the connecting chamber 13 is connected to the processing section 11, however, the present invention is not limited to this and, as is shown in FIG. 16, it is also possible to employ a structure in which a connecting chamber is not provided and the processing section 11 is directly connected (i.e., communicates) from the loader 10 to the unloader 12

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as limited by the foregoing description and is only limited by the scope of the appended claims.

What is claimed is:

1. A coating apparatus that coats a substrate with a liquid material in a coating chamber, comprising:
    a first liquid supply system that supplies the liquid material to the coating chamber; and
    a second liquid supply system that supplies a liquid to the first liquid supply system that cleans or that deactivates the liquid material remaining at least either in the coating chamber or in the first liquid supply system, wherein
    the first liquid supply system includes:
    a container that accumulates the liquid material;
    a drip rate control section that controls a quantity of the liquid material that is drawn out from the container;
    a nozzle section that discharges the liquid material; and
    a liquid material pipe that all runs in a vertical direction without a horizontal portion relative to the vertical direction, and that connects each of the container, the drip rate control section, and nozzle section so that these sections are positioned in the vertical direction in this order from top to bottom.

2. The coating apparatus according to claim 1, further comprising a control mechanism provided with the coating chamber that controls an atmosphere in the coating chamber independently.

3. The coating apparatus according to claim 1, wherein a plurality of the second liquid supply systems are provided and at least one of the second liquid supply systems is a system that supplies a cleaning agent for cleaning the liquid material remaining at least either in the coating chamber or first liquid supply system, and at least one other of the second liquid supply systems is a system that supplies a deactivation agent for deactivating the liquid material remaining at least either in the coating chamber or first liquid supply system.

4. The coating apparatus according to claim 1, wherein the coating chamber has a spin coater provided therein.

5. The coating apparatus according to claim 1, wherein the coating chamber has a droplet discharge section provided therein that discharges micro droplets, and the droplet discharge section has a function of dripping micro droplets on a predetermined position on a substrate held on a stage by moving relatively to the stage holding the substrate.

6. The coating apparatus according to claim 1, wherein the coating chamber has a waste liquid collection mechanism provided therein that collects as waste liquid that is no longer necessary after having been introduced into the coating chamber.

7. A thin film forming apparatus comprising:
a coating apparatus that coats a substrate with a liquid material in a coating chamber; and
a heat processing apparatus that heats a substrate on which a liquid material has been coated by the coating apparatus, wherein
the coating apparatus includes:
a first liquid supply system that supplies the liquid material to the coating chamber; and
a second liquid supply system that supplies a liquid to the first liquid supply system that cleans or that deactivates the liquid material remaining at least either in the coating chamber or in the first liquid supply system, and wherein
the coating apparatus and the heat processing apparatus are each provided with a control mechanism that controls an atmosphere in a processing chamber for processing the substrate independently for the coating apparatus and for the heat processing apparatus.

8. The thin film forming apparatus according to claim 7, further comprising a preprocessing apparatus that performs preprocessing such as cleaning a surface of the substrate, wherein the preprocessing apparatus is also provided with a control mechanism that controls independently an atmosphere in a processing chamber where processing of the preprocessing apparatus is performed.

9. The thin film forming apparatus according to claim 7, further comprising a connecting chamber that is connected to the processing chamber of each of the apparatuses, wherein the connecting chamber is also provided with a control mechanism that controls independently an atmosphere in the connecting chamber.

10. A coating apparatus that coats a substrate with a liquid material, comprising:
a coating chamber in which the substrate is disposed;
a first liquid supply system connected to the coating chamber and supplying the liquid material to the coating chamber;
a second liquid supply system connected to the coating chamber and supplying a deactivation agent for deactivating the liquid material to the coating chamber; and
a third liquid supply system connected to the coating chamber and supplying a cleaning agent for cleaning to the coating chamber.

11. The coating apparatus according to claim 10, further comprising a control mechanism provided with the coating chamber that controls an atmosphere in the coating chamber independently.

12. The coating apparatus according to claim 10, wherein the deactivation agent supplied from the second liquid supply system deactivates the liquid material remaining at least either in the coating chamber or first liquid supply system, and the cleaning agent supplied from the third liquid supply system cleans the liquid material remaining at least either in the coating chamber or first liquid supply system.

13. The coating apparatus according to claim 10, wherein the coating chamber has a spin coater provided therein.

14. The coating apparatus according to claim 10, wherein the first liquid supply system includes:
a container that accumulates the liquid material;
a drip rate control section that controls a quantity of the liquid material that is drawn out from the container;
a nozzle section that discharges the liquid material; and
a liquid material pipe that all runs in a vertical direction without a horizontal portion relative to the vertical direction, and that connects each of the container, the drip rate control section, and nozzle section so that these sections are positioned in the vertical direction in this order from top to bottom.

15. The coating apparatus according to claim 10, wherein the coating chamber has a droplet discharge section provided therein that discharges micro droplets, and the droplet discharge section has a function of dripping micro droplets on a predetermined position on a substrate held on a stage by moving relatively to the stage holding the substrate.

16. The coating apparatus according to claim 10, wherein the coating chamber has a waste liquid collection mechanism provided therein that collects as waste liquid that is no longer necessary after having been introduced into the coating chamber.

17. The coating apparatus according to claim 10, wherein the liquid material includes cyclosilane or high order silane, and the deactivation agent includes isopropanol.

18. The coating apparatus according to claim 10, wherein the liquid material includes cyclosilane or high order silane, and the deactivation agent includes tetramethyl ammonium hydrooxide.

19. The coating apparatus according to claim 14, wherein the deactivation agent is supplied from the second liquid supply system to the coating chamber via at least a part of the liquid material pipe through which the liquid material flows.

20. The coating apparatus according to claim 14, wherein the cleaning agent is supplied from the third liquid supply system to the coating chamber via at least a part of the liquid material pipe through which the liquid material flows.

* * * * *